US012765305B2

(12) United States Patent
Sakamoto et al.

(10) Patent No.: US 12,765,305 B2
(45) Date of Patent: Oct. 13, 2026

(54) SEPARATING APPARATUS, SEPARATING SYSTEM AND SEPARATING METHOD

(71) Applicant: Tokyo Electron Limited, Tokyo (JP)

(72) Inventors: Naoto Sakamoto, Kikuchi-gun (JP); Takashi Sakaue, Kikuchi-gun (JP); Kwangwoo Seo, Kikuchi-gun (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 50 days.

(21) Appl. No.: 18/761,900

(22) Filed: Jul. 2, 2024

(65) Prior Publication Data

US 2025/0014916 A1 Jan. 9, 2025

(30) Foreign Application Priority Data

Jul. 3, 2023 (JP) ................................ 2023-109111

(51) Int. Cl.
*H10P 72/00* (2026.01)

(52) U.S. Cl.
CPC ...... *H10P 72/0428* (2026.01); *H10P 72/0604* (2026.01)

(58) Field of Classification Search
CPC ......... H01L 21/67092; H01L 21/67253; H01L 21/67242; H01L 2221/68386; H10P 72/0428; H10P 72/0604
See application file for complete search history.

(56) References Cited

U.S. PATENT DOCUMENTS

| | | | | |
|---|---|---|---|---|
| 2013/0327463 A1* | 12/2013 | Kitahara | B32B 37/02 | 156/64 |
| 2015/0239227 A1* | 8/2015 | Itou | B32B 43/006 | 156/716 |
| 2025/0014917 A1* | 1/2025 | Sakamoto | H01L 21/67092 | |

FOREIGN PATENT DOCUMENTS

JP 2015-207776 A 11/2015

* cited by examiner

*Primary Examiner* — George R Koch
(74) *Attorney, Agent, or Firm* — Chrisman Gallo Tochtrop LLC

(57) ABSTRACT

A separating apparatus includes a notch device configured to form a notch by inserting a sharp member into a side surface located most adjacent to a separation start point; a first holder including a start point side attraction member and a start point side elevating mechanism; a second holder configured to attract and hold a second substrate; a detection device; and a controller configured to form the notch in the side surface, and lower the start point side attraction member to attract it to a first substrate. The controller moves the start point side attraction member from a standby position to a speed-change position at a first speed; moves the start point side attraction member from the speed-change position to be close to the first substrate at a second speed; and stops the start point side attraction member when it is determined that the first substrate is attracted.

8 Claims, 19 Drawing Sheets

SEPARATING APPARATUS, SEPARATING SYSTEM AND SEPARATING METHOD

CROSS-REFERENCE TO RELATED APPLICATION

This application claims the benefit of Japanese Patent Application No. 2023-109111 filed on Jul. 3, 2023, the entire disclosure of which is incorporated herein by reference.

TECHNICAL FIELD

The exemplary embodiments described herein pertain generally to a separating apparatus, a separating system and a separating method.

BACKGROUND

Recently, in a manufacturing process for a semiconductor device, a semiconductor substrate, such as a silicon wafer and a compound semiconductor wafer, is getting thinner while having a larger diameter. Such a thin large-diameter semiconductor substrate may be bent or broken when it is transferred or polished. To suppress this problem, the semiconductor substrate is transferred and polished after the semiconductor substrate is reinforced by bonding a support substrate thereto. Afterwards, the support substrate is separated from the semiconductor substrate.

PRIOR ART DOCUMENT

Patent Document 1: Japanese Patent Laid-open Publication No. 2015-207776

SUMMARY

In one exemplary embodiment, a separating apparatus includes a notch device configured to form a notch by inserting a sharp member into a side surface located most adjacent to a separation start point among side surfaces of a combined substrate in which a first substrate and a second substrate are bonded to each other; a first holder, configured to attract and hold the first substrate of the combined substrate, including a start point side attraction member configured to attract an edge of an outer periphery located most adjacent to the separation start point in the outer periphery of the first substrate, and a start point side elevating mechanism configured to elevate the start point side attraction member; a second holder configured to attract and hold the second substrate of the combined substrate; a detection device configured to detect attraction of the first substrate by the start point side attraction member; and a controller configured to control the notch device to perform a notch processing of forming the notch in the side surface located most adjacent to the separation start point among the side surfaces of the combined substrate, and control the start point side elevating mechanism to perform an attraction processing of lowering the start point side attraction member to attract the start point side attraction member to the first substrate after the notch processing. In the attraction processing, the controller controls the start point side elevating mechanism to perform a first movement processing of moving the start point side attraction member from a standby position, which is spaced apart from the first substrate, to a speed-change position, which is closer to the first substrate than the standby position, as a position before being contacted with the first substrate at a first speed; controls the start point side elevating mechanism to perform a second movement processing of moving the start point side attraction member from the speed-change position to be close to the first substrate at a second speed, which is lower than the first speed, after the first movement processing; and controls the start point side elevating mechanism to perform a stopping processing of stopping a movement of the start point side attraction member when it is determined that the first substrate is attracted by the start point side attraction member based on a detection result of the detection device during the second movement processing.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

In the detailed description that follows, exemplary embodiments are described as illustrations only since various changes and modifications will become apparent to those skilled in the art from the following detailed description. The use of the same reference numerals in different figures indicates similar or identical items.

DETAILED DESCRIPTION

Figure 1:
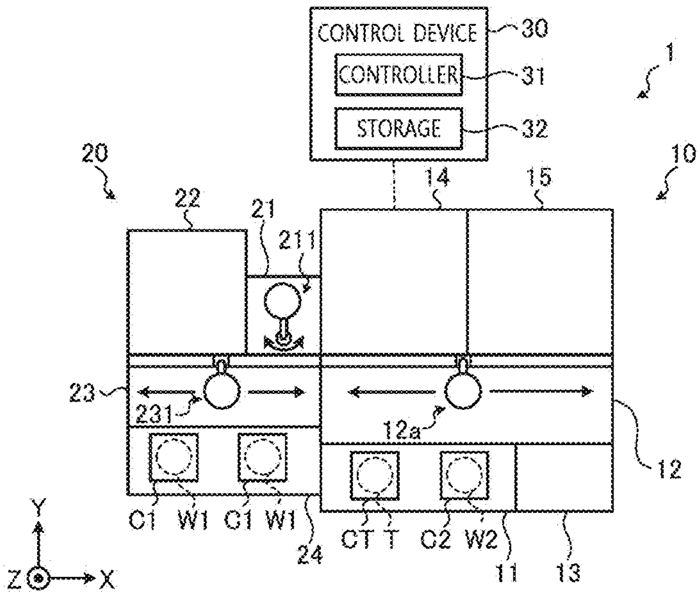
FIG. 1 is a schematic plan view illustrating a configuration of a separating system according to a first exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other exemplary embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

The following exemplary embodiments are examples for describing the present disclosure, and the present disclosure is not limited thereto. In the following description, same parts or parts having same function will be assigned same reference numerals, and redundant description will be omitted.

Hereinafter, embodiments for a separating apparatus, a separating system and a separating method according to the present disclosure (hereinafter, referred to as "exemplary embodiments") will be described in detail with reference to the accompanying drawings. Here, it should be noted that the present disclosure is not limited by the exemplary embodiments. Further, unless processing contents are contradictory, the exemplary embodiments can be appropriately combined. Furthermore, in the exemplary embodiments to be described below, the same parts will be assigned the same reference numerals, and redundant description will be omitted.

Further, in the following exemplary embodiments, expressions such as "constant," "perpendicular," "vertical" and "parallel" may be used. These expressions, however, do not imply strictly "constant", "perpendicular," "vertical" and "parallel". That is, these expressions allow some tolerable errors in, for example, manufacturing accuracy, installation accuracy, or the like.

In the accompanying drawings that are referred to in the following description, the X-axis, Y-axis and Z-axis directions which are orthogonal to each other are defined, and an orthogonal coordinate system in which the positive Z-axis direction is regarded as a vertically upward direction may be used in order to ease understanding of the description. Further, a rotational direction around a vertical axis may be referred to as "θ direction".

Patent Document 1 discloses a processing in which a separation start portion which triggers separation of a support substrate is formed at a side surface of a combined substrate and a non-bonding surface of the support substrate is attracted and held by lowering an attraction movement device to near the support substrate. Specifically, the separation start portion is formed by bringing a sharp member, such as an edged tool, into contact with the side surface of the combined substrate and then moving the sharp member forward to push a part of the support substrate upwards.

However, if the attraction movement device is lowered in a state where a part of the support member is pushed upwards, the attraction movement device may push the support substrate, and, thus, cracks may occur in the support substrate.

In this regard, there is a demand for a technique capable of overcoming the aforementioned problems, thus suppressing the occurrence of cracks in a substrate.

First Exemplary Embodiment

<Configuration of Separating System>

Figure 2:
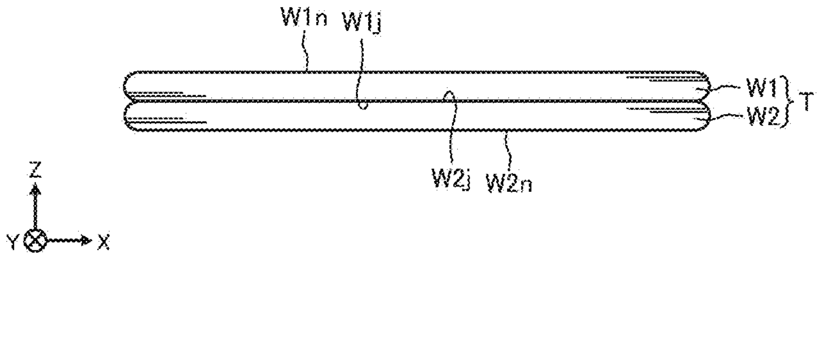
FIG. 2 is a schematic side view of a combined substrate according to the first exemplary embodiment.

First, a configuration of a separating system 1 according to a first exemplary embodiment will be described with reference to FIG. 1 and FIG. 2. FIG. 1 is a schematic plan view illustrating the configuration of the separating system 1 according to the first exemplary embodiment. FIG. 2 is a schematic side view of a combined substrate T according to the first exemplary embodiment.

The separating system 1 shown in FIG. 1 is configured to separate a first substrate W1 shown in FIG. 2 from the combined substrate T in which the first substrate W1 and a second substrate W2 are bonded to each other by an intermolecular force. In the following description, the first substrate W1 will be referred to as "upper wafer W1", and the second substrate W2 will be referred to as "lower wafer W2". That is, the upper wafer W1 is an example of the first substrate, and the lower wafer W2 is an example of the second substrate.

In the following description, as shown in FIG. 2, among surfaces of the upper wafer W1, a surface to be bonded to the lower wafer W2 will be referred to as "bonding surface W1*j*", and a surface opposite to the bonding surface W1*j* will be referred to as "non-bonding surface W1*n*". Further, among surfaces of the lower wafer W2, a surface to be bonded to the upper wafer W1 will be referred to as "bonding surface W2*j*", and a surface opposite to the bonding surface W2*j* will be referred to as "non-bonding surface W2*n*".

The upper wafer W1 is, for example, a semiconductor substrate, such as a silicon wafer or a compound semiconductor wafer, on which a plurality of electronic circuits is formed. Further, the lower wafer W2 is, for example, a bare wafer on which no electronic circuit is formed. The upper wafer W1 and the lower wafer W2 have substantially the same diameter. Further, the lower wafer W2 may have an electronic circuit formed thereon.

As shown in FIG. 1, the separating system 1 has two processing blocks: a first processing block 10 and a second processing block 20. The first processing block 10 and the second processing block 20 are disposed adjacent to each other.

In the first processing block 10, carrying-in of the combined substrate T, separating of the combined substrate T, and cleaning and carrying-out of the lower wafer W2 after being separated are performed. The first processing block 10 includes a carry-in/out station 11, a first transfer section 12, a standby station 13, a separation station 14, and a first cleaning station 15.

The carry-in/out station 11, the standby station 13, the separation station 14, and the first cleaning station 15 are disposed adjacent to the first transfer section 12. Specifically, the carry-in/out station 11 and the standby station 13 are arranged on the negative Y-axis side of the first transfer section 12, and the separation station 14 and the first cleaning station 15 are arranged on the positive Y-axis side of the first transfer section 12.

A plurality of cassette placing tables is provided in the carry-in/out station 11, and a cassette Ct accommodating therein the combined substrate T and a cassette C2 accommodating therein the lower wafer W2 after being separated are respectively placed on the cassette placing tables.

A first transfer device 12*a* configured to transfer the combined substrate T or the lower wafer W2 after being separated is disposed in the first transfer section 12. The first transfer device 12*a* is equipped with: a transfer arm configured to be movable in a horizontal direction, movable up and down in a vertical direction, and pivotable about a vertical direction; and a substrate holder provided on a leading end of the transfer arm. The first transfer device 12*a* is an example of a substrate transfer device.

In the first transfer section 12, a processing of transferring the combined substrate T to the standby station 13 and the separation station 14 and a processing of transferring the lower wafer W2 after being separated to the first cleaning station 15 and the carry-in/out station 11 are performed by the first transfer device 12*a*.

In the standby station 13, a standby processing of allowing the combined substrate T to temporarily stand by before being subjected to a processing is performed when necessary. A placing table, on which the combined substrate T transferred by the first transfer device 12*a* is placed, is disposed in this standby station 13.

In the separation station 14, a separating apparatus 5 (see FIG. 3) is disposed, and a separating processing of separating the upper wafer W1 from the combined substrate T is performed by the separating apparatus 5. A specific configuration and operation of the separating apparatus 5 will be described later.

In the first cleaning station 15, a cleaning processing on the lower wafer W2 after being separated is performed. In the first cleaning station 15, a first cleaning apparatus configured to clean the lower wafer W2 after being separated is disposed. As the first cleaning apparatus, one described in, for example, Japanese Patent Laid-open Publication No. 2013-033925 may be used.

In the second processing block 20, cleaning and carrying-out of the upper wafer W1 after being separated are performed. The second processing block 20 is equipped with a delivery station 21, a second cleaning station 22, a second transfer section 23, and a carry-out station 24. The second cleaning station 22 is an example of a cleaning apparatus.

The delivery station 21, the second cleaning station 22, and the carry-out station 24 are arranged adjacent to the second transfer section 23. Specifically, the delivery station 21 and the second cleaning station 22 are arranged on the positive Y-axis side of the second transfer section 23, and the carry-out station 24 is disposed on the negative Y-axis side of the second transfer section 23.

The delivery station 21 is disposed adjacent to the separation station 14 of the first processing block 10. In the delivery station 21, a delivery processing of receiving the separated upper wafer W1 from the separation station 14 and handing it over to the second cleaning station 22 is performed.

A second transfer device 211 is disposed in the delivery station 21. The second transfer device 211 has a non-contact holder, such as a Bernoulli chuck. The upper wafer W1 after being separated is transferred in a non-contact manner by the second transfer device 211.

In the second cleaning station 22, a second cleaning processing of cleaning the separated upper wafer W1 is performed. A second cleaning apparatus configured to clean the separated upper wafer W1 is disposed in the second cleaning station 22. As the second cleaning apparatus, one described in, for example, Japanese Patent Laid-open Publication No. 2013-033925 may be used.

A third transfer device 231 configured to transfer the separated upper wafer W1 is disposed in the second transfer section 23. The third transfer device 231 is equipped with: a transfer arm configured to be movable in a horizontal direction, movable up and down in a vertical direction, and pivotable about a vertical axis; and a substrate holder provided on a leading end of the transfer arm. In the second transfer section 23, a processing of transferring the separated upper wafer W1 to the carry-out station 24 is performed by the third transfer device 231.

A plurality of cassette placing tables is provided in the carry-out station 24, and a cassette C1 accommodating therein the separated upper wafer W1 is placed on each of the cassette placing tables.

Further, the separating system 1 is equipped with a control device 30. The control device 30 controls an operation of the separating system 1. The control device 30 is, for example, a computer, and includes a controller 31 and a storage 32. The storage 32 stores therein a program for controlling various processings, such as a bonding processing. The controller 31 controls the operation of the separating system 1 by reading and executing the program stored in the storage 32.

The program may be recorded on a computer-readable recording medium and installed from this recording medium to the storage 32 of the control device 30. The computer-readable recording medium may be, for example, a hard disk (HD), a flexible disk (FD), a compact disk (CD), a magnet optical disk (MO), or a memory card.

In the separating system 1 configured as described above, the first transfer device 12*a* of the first processing block 10 first takes out the combined substrate T from the cassette Ct disposed in the carry-in/out station 11, and carries the taken combined substrate T into the standby station 13.

For example, when the combined substrate T needs to stand by before being subjected to a processing due to a difference in processing time between the apparatuses, the combined substrate T may be temporarily placed on standby by using a temporary standby device provided in the standby station 13. Thus, a loss time between a series of processes can be shortened.

Then, the combined substrate T is taken out from the standby station 13 by the first transfer device 12*a* and carried into the separation station 14. Thereafter, the separating apparatus 5 disposed in the separation station 14 performs the separating processing on the combined substrate T. By the separating processing, the combined substrate T is separated into the upper wafer W1 and the lower wafer W2.

The lower wafer W2 after being separated is taken out from the separation station 14 by the first transfer device 12*a* and carried into the first cleaning station 15. In the first cleaning station 15, the first cleaning apparatus performs a first cleaning processing on the lower wafer W2 after being separated. By the first cleaning processing, the bonding surface W2*j* of the lower wafer W2 is cleaned.

The lower wafer W2 after being subjected to the first cleaning processing is taken out from the first cleaning station 15 by the first transfer device 12*a*, and is accommodated in the cassette C2 disposed in the carry-in/out station 11. Thereafter, the cassette C2 is taken out from the carry-in/out station 11 and collected. In this way, the processing upon the lower wafer W2 is ended.

Meanwhile, in the second processing block 20, processings upon the upper wafer W1 after being separated are performed in parallel with the above-described processings in the first processing block 10.

In the second processing block 20, the second transfer device 211 disposed in the delivery station 21 first takes out the separated upper wafer W1 from the separation station 14, and carries it into the second cleaning station 22.

Here, a top surface, i.e., the non-bonding surface W1*n*, of the separated upper wafer W1 is held by the separating apparatus 5, and the second transfer device 211 holds the bonding surface W1*j* side of the upper wafer W1 from below in a non-contact manner. Thereafter, the second transfer device 211 turns the held upper wafer W1 upside down, and then places it in the second cleaning apparatus of the second cleaning station 22.

Accordingly, the upper wafer W1 is placed in the second cleaning apparatus with its bonding surface W1*j* facing upwards. Then, the second cleaning apparatus performs a second cleaning processing of cleaning the bonding surface W1*j* of the upper wafer W1. By the second cleaning processing, the bonding surface W1*j* of the upper wafer W1 is cleaned.

The upper wafer W1 after being subjected to the second cleaning processing is taken out from the second cleaning station 22 by the third transfer device 231 disposed in the second transfer section 23, and accommodated in the cassette C1 disposed in the carry-out station 24. Thereafter, the cassette C1 is taken out from the carry-out station 24 and collected. In this way, the processing upon the upper wafer W1 is ended.

As described above, the separating system 1 according to the first exemplary embodiment includes a front end for the combined substrate T and the lower wafer W2 after being separated, and a front end for the upper wafer W1 after being separated.

Here, the front end for the combined substrate T and the lower wafer W2 after being separated includes the carry-in/out station 11 and the first transfer device 12*a*, and the front end for the upper wafer W1 after being separated includes the carry-out station 24 and the third transfer device 231.

With this configuration, the processing of transferring the upper wafer W1 to the carry-in/out station 11 can be performed in parallel with the processing of transferring the lower wafer W2 to the carry-out station 24. Therefore, a series of substrate processings can be performed efficiently.

Furthermore, in the separating system 1 according to the first exemplary embodiment, the separation station 14 and the second cleaning station 22 are connected to each other with the delivery station 21 interposed therebetween. Accordingly, it becomes possible to directly carry the separated upper wafer W1 out of the separation station 14 into the second cleaning station 22 without passing through the first transfer section 12 and the second transfer section 23. Therefore, the upper wafer W1 after being separated can be transferred smoothly.

<Configuration of Separating Apparatus>

Figure 3:
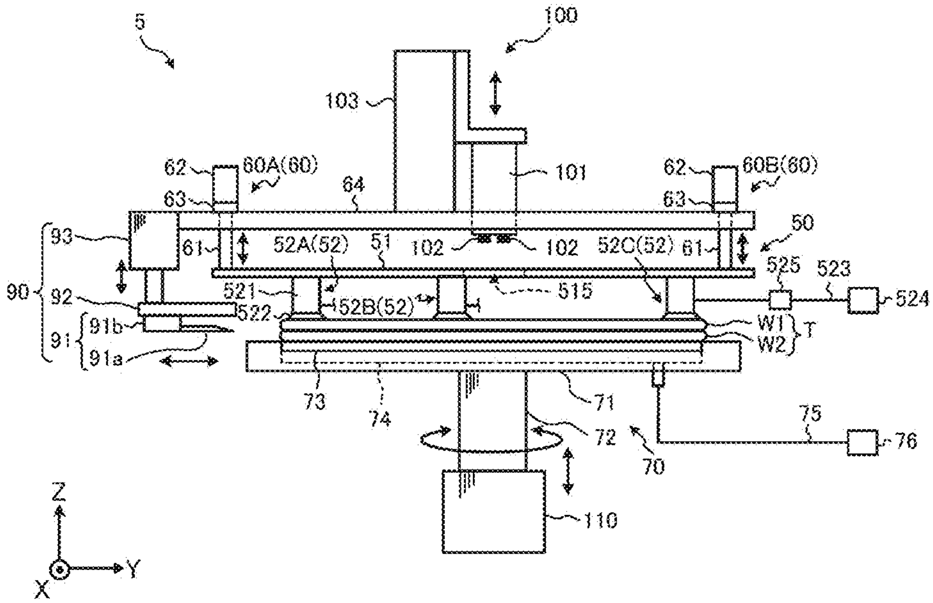
FIG. 3 is a schematic side view illustrating a configuration of a separating apparatus according to the first exemplary embodiment.

Hereinafter, a configuration of the separating apparatus 5 provided in the separation station 14 will be described with reference to FIG. 3. FIG. 3 is a schematic side view illustrating a configuration of the separating apparatus 5 according to the first exemplary embodiment.

The separating apparatus 5 includes a first holder 50, a second holder 70, a notch device 90, and a third holder 100.

The separating apparatus 5 attracts and holds the upper wafer W1 side of the combined substrate T from above by the first holder 50, and attracts and holds the lower wafer W2 side of the combined substrate T from below by the second holder 70. Further, the separating apparatus 5 moves the upper wafer W1 to be away from a plate surface of the lower wafer W2 (herein, in the positive Z-axis direction) by an elevating mechanism 60.

Accordingly, the upper wafer W1 held by the first holder 50 is continuously separated from the lower wafer W2, starting from one end thereof toward the other end. Hereinafter, each component of the separating apparatus 5 will be described in detail.

The first holder 50 attracts and holds the non-bonding surface Win of the upper wafer W1 of the combined substrate T. The first holder 50 includes an elastic member 51, a plurality of attraction members 52, and a plurality of elevating mechanisms 60. The elastic member 51 is a thin plate-shaped member, and is formed of a metal such as a metal plate. The elastic member 51 may have an opening 515 at a central portion to allow the third holder 100 to pass through. The elastic member 51 is disposed above the upper wafer W1 to face the upper wafer W1.

The plurality of attraction members 52 is provided on a surface (herein, lower surface) of the elastic member 51 facing the upper wafer W1. Each attraction member 52 is equipped with a main body 521 fixed to the elastic member 51 and an attraction pad 522 provided under the main body 521.

Each attraction member 52 is connected to an air intake device 524 such as a vacuum pump via an air intake line 523. The first holder 50 attracts the non-bonding surface W1*n* (see FIG. 2) of the upper wafer W1 by the plurality of attraction members 52 with a suction force generated by the air intake device 524. Accordingly, the upper wafer W1 is attracted to and held by the first holder 50.

Moreover, it is desirable that the attraction pad 522 included in the attraction member 52 is of a type having little deformation. This is because if the attraction pad 522 is greatly deformed when the elevating mechanism 60 to be described later pulls the first holder 50, a to-be-attracted portion of the upper wafer W1 can be greatly deformed along with the deformation of the attraction pad 522, which may cause damage to the upper wafer W1 or the lower wafer W2. Specifically, for example, it is desirable to use one having a rib on an attraction surface thereof or a flat pad having a space height of 0.5 mm or less as the attraction pad 522.

The separating apparatus 5 also includes a detection device 525 configured to detect attraction of the upper wafer W1 by the attraction member 52. The detection device 525 may be, for example, a pressure detection device configured to detect a suction pressure of the attraction pad 522 included in the attraction member 52. The detection device 525 serving as a pressure detection device is provided at a portion of, for example, the air intake line 523.

The plurality of (herein, two) elevating mechanisms 60 elevates and lowers the plurality of attraction members 52. As shown in FIG. 3, the plurality of elevating mechanisms 60 includes a start point side elevating mechanism 60A and an end point side elevating mechanism 60B. The start point side elevating mechanism 60A and the end point side elevating mechanism 60B are provided respectively corresponding to a plurality of (herein, two) extension portions 512 of the elastic member 51 to be described later. Specifically, the start point side elevating mechanism 60A is provided corresponding to the extension portion 512 located on the negative Y-axis side among the two extension portions 512. Also, the end point side elevating mechanism 60B is provided corresponding to the extension portion 512 located on the positive Y-axis side among the two extension portions 512.

The elevating mechanism 60 includes a support column member 61, a moving mechanism 62, and a load cell 63.

The support column member 61 is a member extending in the vertical direction (Z-axis direction) with one end thereof connected to the extension portion 512 (see FIG. 4) of the elastic member 51 and the other end connected to the moving mechanism 62 via a support body 64.

The moving mechanism 62 is fixed on top of the support body 64, and is configured to move the support column member 61 connected below in the vertical direction. The load cell 63 detects a load applied to the support column member 61.

The elevating mechanism 60 elevates and lowers the extension portion 512 of the elastic member 51 connected to the support column member 61 by moving the support column member 61 in the vertical direction by the moving mechanism 62, and also elevates and lowers the attraction member 52 provided in the elastic member 51.

Specifically, the start point side elevating mechanism 60A elevates and lowers the extension portion 512 located on the negative Y-axis side and connected to the support column member 61 by moving the support column member 61 in the vertical direction by the moving mechanism 62, and also elevates a start point side attraction member 52A adjacent to the extension portion 512 located on the negative Y-axis side. Likewise, the end point side elevating mechanism 60B elevates the extension portion 512 located on the positive Y-axis side and connected to the support column member 61 by moving the support column member 61 in the vertical direction by the moving mechanism 62, and also elevates and lowers an end point side attraction member 52C adjacent to the extension portion 512 located on the positive Y-axis side.

Figure 4:
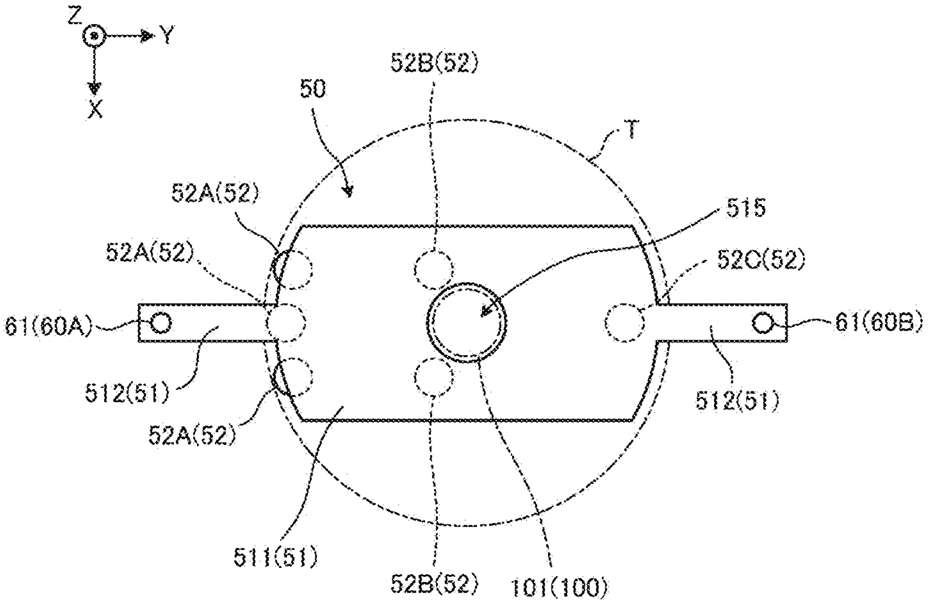
FIG. 4 is a schematic plan view of a first holder according to the first exemplary embodiment.

Herein, as shown in FIG. 3 and FIG. 4, the support column member 61 serving as a power point of the elevation, i.e., the support column member 61 of the start point side elevating mechanism 60A, is disposed opposite to the attraction member 52 serving as a fulcrum of the elevation, i.e., the start point side attraction member 52A disposed on a separation start point, in a separation progress direction.

Therefore, a torque (moment) acting clockwise in FIG. 3 is generated in a side surface (a separation start point) of the combined substrate T which serves as an acting point of the elevation. Accordingly, the start point side elevating mechanism 60A can pull up the upper wafer W1 such that the upper wafer W1 may be moved up from its outer edge. Thus, the upper wafer W1 can be efficiently separated from the lower wafer W2.

Further, the first holder 50 is supported by the elevating mechanism 60, and the elevating mechanism 60 is supported by the support body 64. Furthermore, the support body 64 is supported by a fixed member (not shown) mounted on a ceiling portion of the separating apparatus 5.

Hereinafter, a configuration of the first holder 50 will be described in more detail with reference to FIG. 4. FIG. 4 is a schematic plan view of the first holder 50 according to the first exemplary embodiment.

The elastic member 51 is equipped with a main body 511 and the plurality of (herein, two) extension portions 512. The main body 511 has the opening 515 at a central portion to allow the third holder 100 to pass through. Herein, the central portion of the main body 511 is a portion including the center of the main body 511. The plurality of attraction members 52 is provided on a lower surface of the main body 511, i.e., a surface facing the combined substrate T.

The plurality of (herein, two) extension portions 512 includes portions formed by extending a part of an outer periphery of the main body 511. Specifically, one of the two extension portions 512 is a portion formed by extending a part of the outer periphery of the main body 511 located most adjacent to the separation start point (the outer periphery on the negative Y-axis side) toward a side (negative Y-axis side) opposite to the separation progress direction. Also, the other one of the two extension portions 512 is a portion formed by extending a part of the outer periphery of the main body 511 located most adjacent to a separation end point (the outer periphery on the positive Y-axis side) toward a side (positive Y-axis side) of the separation progress direction. The support column members 61 of the elevating mechanism 60 are connected to leading ends of the plurality of extension portions 512, respectively.

The plurality of (herein, six) attraction members 52 is provided on the lower surface of the main body 511. As shown in FIG. 4, the plurality of attraction members 52 includes three start point side attraction members 52A, two opening side attraction members 52B, and one end point side attraction member 52C. The three start point side attraction members 52A are provided on an edge of the outer periphery of the main body 511 located most adjacent to the separation start point (the outer periphery on the negative Y-axis side). Therefore, the one start point side attraction member 52A attracts an edge of an outer periphery of the upper wafer W1 located most adjacent to the separation start point. The two opening side attraction members 52B are arranged around the opening 515 of the main body 511 in a direction (X-axis direction) orthogonal to the separation progress direction (positive Y-axis direction). The one end point side attraction member 52C is provided on the outer periphery of the main body 511 located most adjacent to the separation end point (the outer periphery on the positive Y-axis side). Therefore, the one end point side attraction member 52C attracts an edge of an outer periphery of the upper wafer W1 located most adjacent to the separation end point. The six attraction members 52 are arranged in sequence of the three start point side attraction members 52A, the two opening side attraction members 52B, and the one end point side attraction member 52C along the separation progress direction (Y-axis direction). As such, the plurality of attraction members 52 is arranged in the separation progress direction. Thus, the upper wafer W1 can be efficiently separated from the lower wafer W2.

The attraction member 52 located most adjacent to the separation start point (herein, the negative Y-axis side) among the three start point side attraction members 52A is provided at a position adjacent to a contact portion with a sharp member 91*a* (see FIG. 3) of the notch device 90 to be described later. In other words, the sharp member 91*a* of the notch device 90 is in contact with a side surface of the combined substrate T around the start point side attraction member 52A located on the negative Y-axis side. Although there has been described an example where the six attraction members 52 are provided on the elastic member 51, the number of attraction members 52 provided on the elastic member 51 is not limited to six.

Referring back to FIG. 3, the other components of the separating apparatus 5 will be described. The second holder 70 is disposed below the first holder 50, and attracts and holds the lower wafer W2 of the combined substrate T. The second holder 70 includes a circular plate-shaped main body 71 and a support column member 72 supporting the main body 71.

The main body 71 is formed of, for example, a metal member such as aluminum. An attraction surface 73 is provided on a top surface of the main body 71. The attraction surface 73 has substantially the same diameter as the lower wafer W2. The attraction surface 73 is a porous body, and is formed of, for example, a resin member such as PCTFE (polychlorotrifluoroethylene).

A suction space 74 is formed inside the main body 71 to communicate with the outside through the attraction surface 73. The suction space 74 is connected to an air intake device 76 such as a vacuum pump via an air intake line 75. The second holder 70 attracts the non-bonding surface W2*n* (see FIG. 2) of the lower wafer W2 to the attraction surface 73 by using a negative pressure generated by the air intake of the air intake device 76, and thus attracts and holds the combined substrate T.

Also, if a non-attraction portion such as a groove is formed on the attraction surface for the lower wafer W2, cracks may occur in the lower wafer W2 at the non-attraction portion. To suppress this problem, the attraction surface 73 of the main body 71 is formed as a flat surface without a non-attraction portion such as a groove. Therefore, it is possible to suppress the occurrence of cracks in the lower wafer W2.

Further, since the attraction surface 73 is formed of the resin member such as PCTFE, it is possible to further suppress damage to the lower wafer W2.

The second holder 70 is supported by the support column member 72 and a rotating/elevating mechanism 110 (an example of a rotating mechanism). The rotating/elevating mechanism 110 is configured to rotate the second holder 70 by rotating the support column member 72 about a vertical axis. Further, the rotating/elevating mechanism 110 elevates and lowers the second holder 70 by moving the support column member 72 in the vertical direction.

The notch device 90 is disposed outside the second holder 70, and forms a notch in a side surface of the combined substrate T located most adjacent to the separation start point.

The notch device 90 is equipped with a blade 91, a moving mechanism 92, and an elevating mechanism 93. The blade 91 includes the sharp member 91*a* and a support portion 91*b*. The sharp member 91*a* is, for example, a flat blade, and is supported by the support portion 91*b* so that a tip of the blade horizontally projects toward the combined substrate T.

The moving mechanism 92 moves the blade 91 along a rail extending in the Y-axis direction. The elevating mechanism 93 is fixed to, for example, the support body 64, and serves to move the moving mechanism 92 in the vertical direction. Thus, a height position of the blade 91, i.e., a contact position with respect to the side surface of the combined substrate T is adjusted.

Figure 5A:
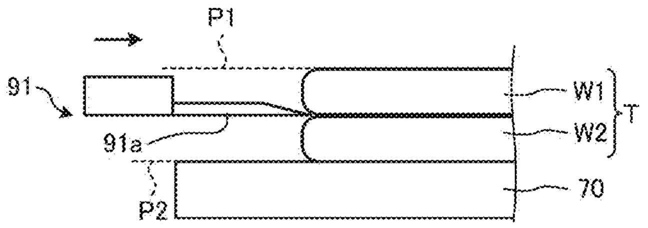
FIG. 5A is a diagram for describing an operation of a notch processing.
Figure 5B:
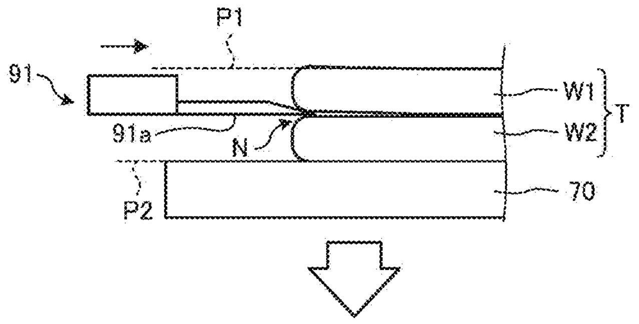
FIG. 5B is a diagram for describing an operation of the notch processing.
Figure 5C:
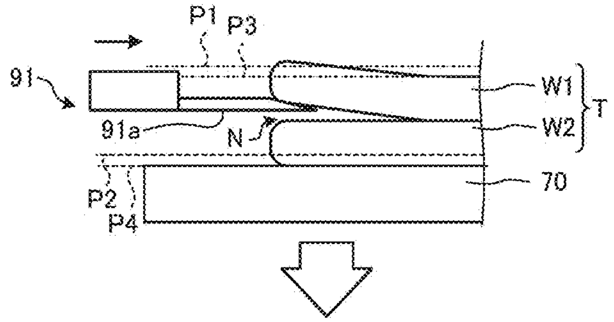
FIG. 5C is a diagram for describing an operation of the notch processing.

Hereinafter, a notch processing performed by the notch device 90 will be described in detail with reference to FIG. 5A to FIG. 5C. FIG. 5A to FIG. 5C are diagrams for describing operations of the notch processing.

The notch processing is performed before the upper wafer W1 is attracted and held by the first holder 50 while the lower wafer W2 of the combined substrate T is attracted and held by the second holder 70. That is, the notch processing is performed while the upper wafer W1 is in a free state. Also, the separating apparatus 5 performs the notch processing shown in FIG. 5A to FIG. 5C under the control of the control device 30.

After adjusting the height position of the blade 91 by using the elevating mechanism 93, the separating apparatus 5 moves the blade 91 toward the side surface of the combined substrate T by using the moving mechanism 92. Then, the separating apparatus 5 brings the sharp member 91*a* of the blade 91 into contact with a bonding portion of the upper wafer W1 and the lower wafer W2 exposed on the side surface of the combined substrate T (see FIG. 5A).

Thereafter, the separating apparatus 5 further moves the blade 91 forward to insert the sharp member 91*a* into the side surface of the combined substrate T (see FIG. 5B). Thus, the upper wafer W1 is pushed upwards along the curved side surface. As a result, a part of the upper wafer W1 is separated from the lower wafer W2 and a notch N is formed.

Also, since the upper wafer W1 is not attracted and held by the first holder 50 but is kept in a free state, the upward movement of the upper wafer W1 is not limited.

After the notch N is formed, the separating apparatus 5 lowers the second holder 70 by using the rotating/elevating mechanism 110 (see FIG. 3) and further moves the sharp member 91a forward. Thus, a downward force is applied to the lower wafer W2 and an upward force is applied to the upper wafer W1 supported by the sharp member 91a. Therefore, the notch N is expanded.

As described above, the separating apparatus 5 can form the notch N by hitting the side surface of the combined substrate T with the sharp member 91a.

Also, if an adhesion between the upper wafer W1 and the lower wafer W2 is relatively small, the notch N can be formed just by bringing the sharp member 91a into contact with the side surface of the combined substrate T. In this case, the separating apparatus 5 may skip the operations shown in FIG. 5B and FIG. 5C.

If the adhesion between the upper wafer W1 and the lower wafer W2 is relatively strong, the separating apparatus 5 may form a plurality of notches N in the side surface of the combined substrate T by rotating the second holder 70 around the vertical axis by using the rotating/elevating mechanism 110. Details thereof will be described later with reference to FIG. 8.

Herein, there has been described an example where the second holder 70 is lowered by controlling the rotating/elevating mechanism 110 as well as the notch device 90 in the notch processing. However, the present disclosure is not limited thereto. In the notch processing, the second holder 70 may not be lowered, but the blade 91 may be moved upwards by controlling the elevating mechanism 93 of the notch device 90. Alternatively, the second holder 70 may be lowered and the blade 91 may be moved upwards.

Referring back to FIG. 3, the other components of the separating apparatus 5 will be described. The third holder 100 is disposed above the first holder 50, and attracts and holds the non-bonding surface Win of the separated first substrate W1 held by the first holder 50 (see FIG. 2). The third holder 100 includes a main body 101, a plurality of attraction pads 102, and an elevating mechanism 103.

The main body 101 is, for example, a cylindrical member, and is inserted through the opening 515 of the elastic member 51. The main body 101 supports the plurality of attraction pads 102. The plurality of attraction pads 102 is provided at a lower portion of the main body 101.

The elevating mechanism 103 elevates and lowers the plurality of attraction pads 102 supported by the main body 101 by moving the main body 101 in the vertical direction. Specifically, the elevating mechanism 103 elevates and lowers the plurality of attraction pads 102 among a standby position, an attraction position where the separated first substrate W1 held by the first holder 50 is attracted, and a delivery position where the first substrate W1 attracted and held by the third holder 100 is delivered to the second transfer device 211. The elevating mechanism 103 is fixed on, for example, the support body 64 and supported by the support body 64.

The third holder 100 may receive the separated first substrate W1 from the first holder 50 and deliver the received first substrate W1 stably to the second transfer device 211.

The separating apparatus 5 according to the first exemplary embodiment is configured as described above. The separating apparatus 5 forms a notch in the side surface of the combined substrate T by using the notch device 90, moves the attraction member 52 of the first holder 50 to be close to the upper wafer W1, attracts and holds the non-bonding surface Win of the upper wafer W1, and then moves the attraction member 52 to be away from the upper wafer W1.

Hereinafter, an example of movement of the attraction member 52 in a conventional notch processing and attraction processing will be described with reference to FIG. 5A to FIG. 5C. In the conventional processing as shown in FIG. 5A, a height position P1 of the non-bonding surface W1n of the upper wafer W1 (see FIG. 2) is set to an expected attraction position of the attraction member 52 before the notch N is formed in the side surface of the combined substrate T. Then, the notch N is formed in the side surface of the combined substrate T, and when the second holder 70 is moved from a height position P2 to a height position P4 as shown in FIG. 5C, the expected attraction position of the attraction member 52 is also changed accordingly from the height position P1 to a height position P3.

Then, the attraction member 52 is lowered to the height position P3, which is the expected attraction position, and attracts the non-bonding surface Win of the upper wafer W1. However, in this case, a part of the upper wafer W1 is pushed upwards by the sharp member 91a and thus may be pushed by the attraction member 52 in a vertically downward direction. Therefore, cracks may occur in the upper wafer W1.

In this regard, the separating apparatus 5 according to the first exemplary embodiment monitors an attraction state of the upper wafer W1 by the attraction member 52 while controlling a movement of the attraction member 52, and stops the movement of the attraction member 52 when the upper wafer W1 is attracted. Therefore, it is possible to suppress the occurrence of cracks in the upper wafer W1.

Figure 6:
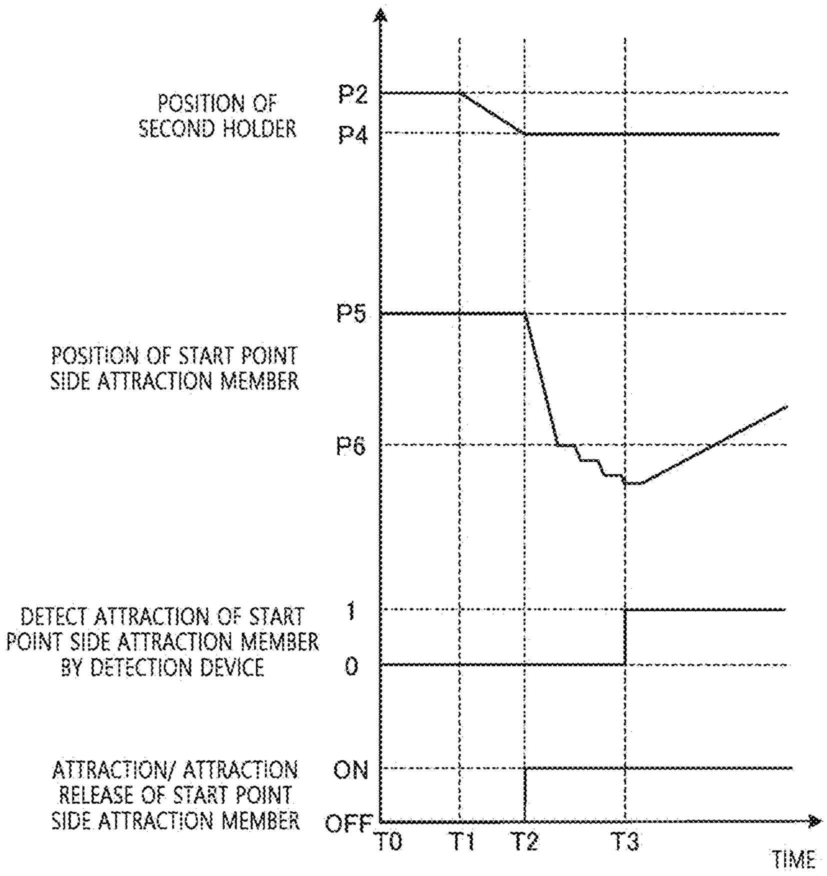
FIG. 6 shows an example of a change of a position of a start point side attraction member in a vertical direction.

Hereinafter, the movement of the attraction member 52 under the control of the controller 31 according to the first exemplary embodiment will be described with reference to FIG. 6. FIG. 6 shows positions of the second holder 70 and the start point side attraction member 52A in the vertical direction, a state in which attraction by the start point side attraction member 52A is detected by the detection device 525, and an example of a change of the attraction state of the start point side attraction member 52A. FIG. 6 illustrates that when the detection device 525 detects attraction of the upper wafer W1 by the start point side attraction member 52A, "1" represents a case where the detection device 525 detects the attraction by the start point side attraction member 52A and "0" represents a case where the detection device 525 does not detect the attraction by the start point side attraction member 52A.

As shown in FIG. 6, the controller 31 starts a notch processing from a time point TO and moves the second holder 70 from the height position P2 to the height position P4 at a time point T2 (see FIG. 5C) according to the first exemplary embodiment. Then, the controller 31 starts attraction by the start point side attraction member 52A from the time point T2 when the second holder 70 reaches the height position P4, and moves the start point side attraction member 52A from a standby position P5 to a speed-change position P6 at a first speed simultaneously. Herein, the standby position P5 refers to a position spaced apart from the upper wafer W1. Specifically, the standby position refers to a position higher than a height position of a top surface (the non-bonding surface W1n) of the upper wafer W1. The speed-change position P6 refers to a position closer to the upper wafer W1 than the standby position P5, i.e., a position before contact between the attraction member 52 and the upper wafer W1.

Then, when the start point side attraction member 52A arrives at the speed-change position P6, the controller 31 moves the start point side attraction member 52A at a second speed, which is lower than the first speed, to be close to the upper wafer W1. Specifically, as shown in FIG. 6, the controller 31 moves the start point side attraction member 52A to be close to the upper wafer W1 by repeating a processing of moving the start point side attraction member 52A by a predetermined distance at the second speed and a processing of stopping the start point side attraction member 52A.

Then, if the detection device 525 detects attraction of the upper wafer W1 by the start point side attraction member 52A at a time point T3, the controller 31 stops the movement of the start point side attraction member 52A.

<Specific Operation of Separating System>

Figure 7:
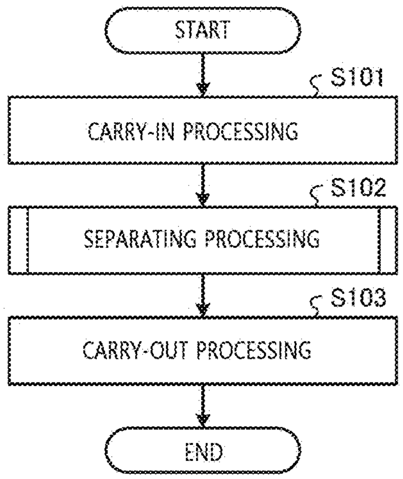
FIG. 7 is a flowchart illustrating a sequence of processings performed by the separating system according to the first exemplary embodiment.
Figure 10A:
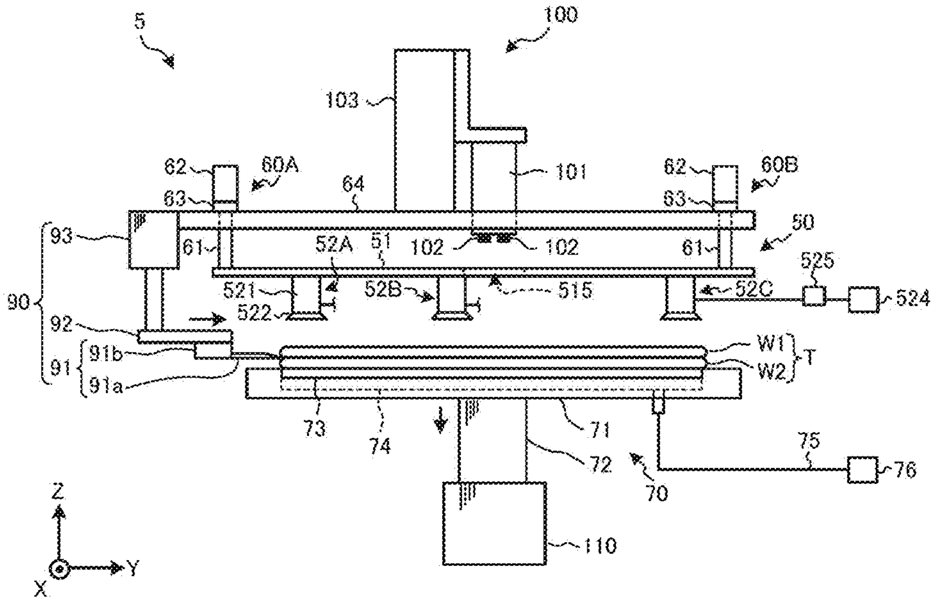
FIG. 10A is a schematic view illustrating an operation example of the separating system according to the first exemplary embodiment.
Figure 10B:
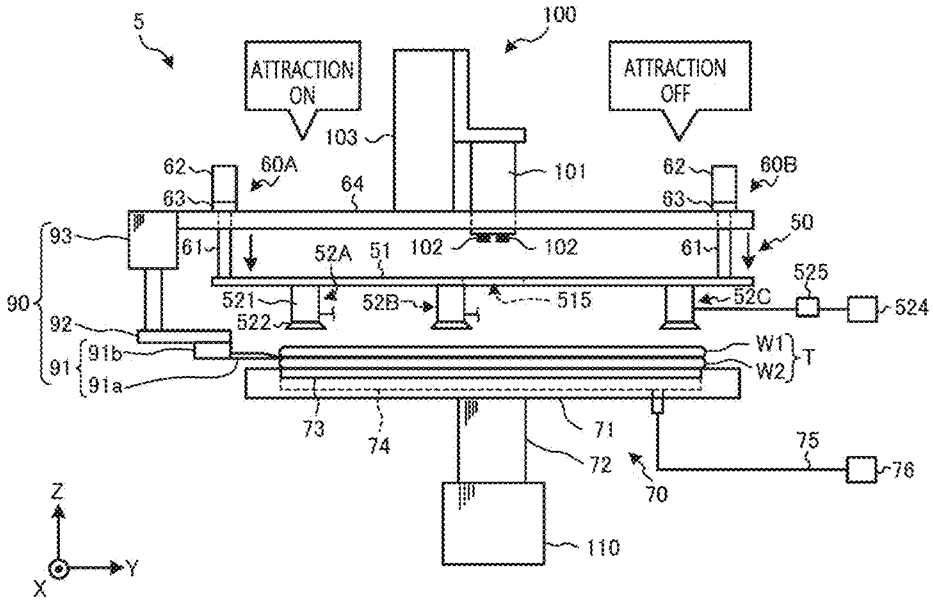
FIG. 10B is a schematic view illustrating an operation example of the separating system according to the first exemplary embodiment.
Figure 10C:
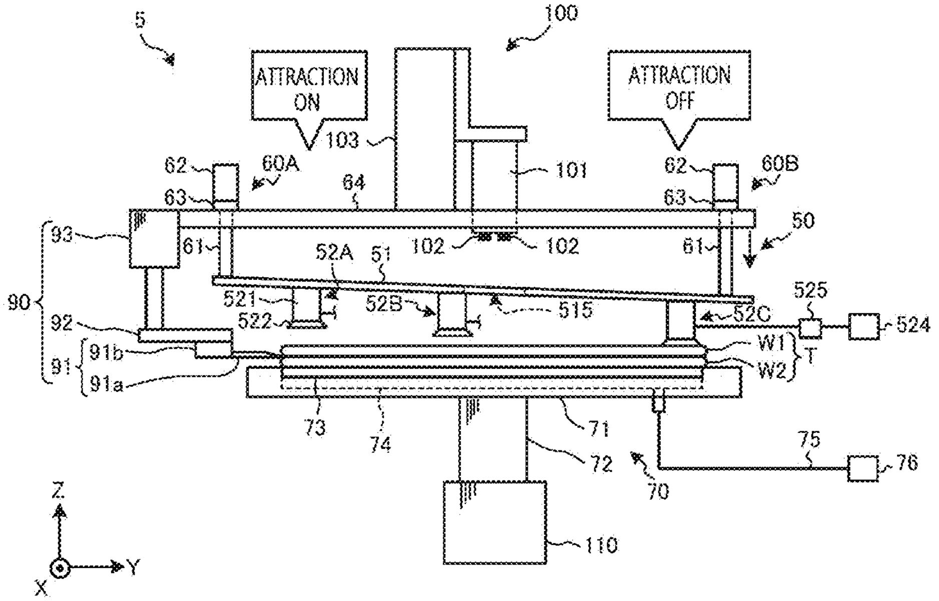
FIG. 10C is a schematic view illustrating an operation example of the separating system according to the first exemplary embodiment.
Figure 10D:
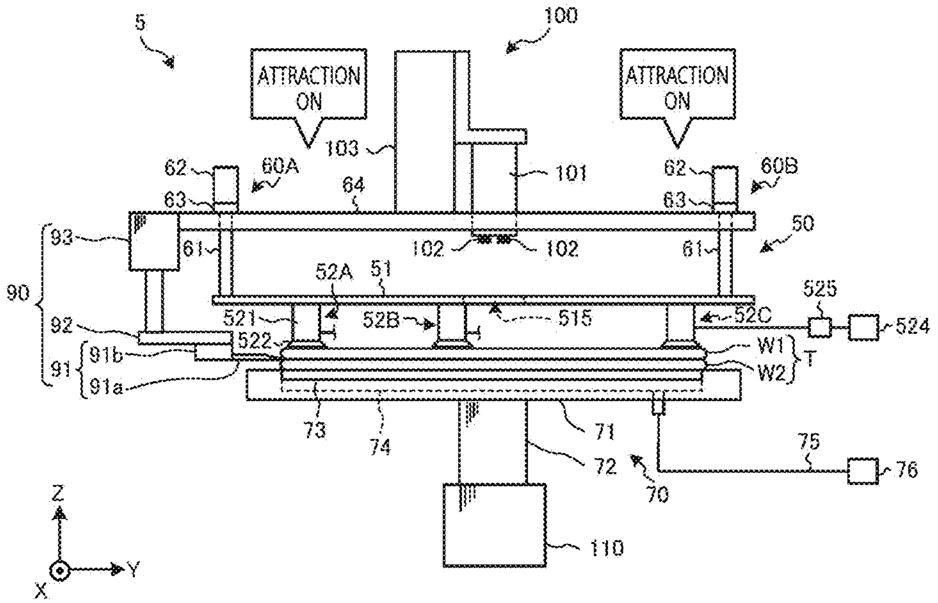
FIG. 10D is a schematic view illustrating an operation example of the separating system according to the first exemplary embodiment.
Figure 10E:
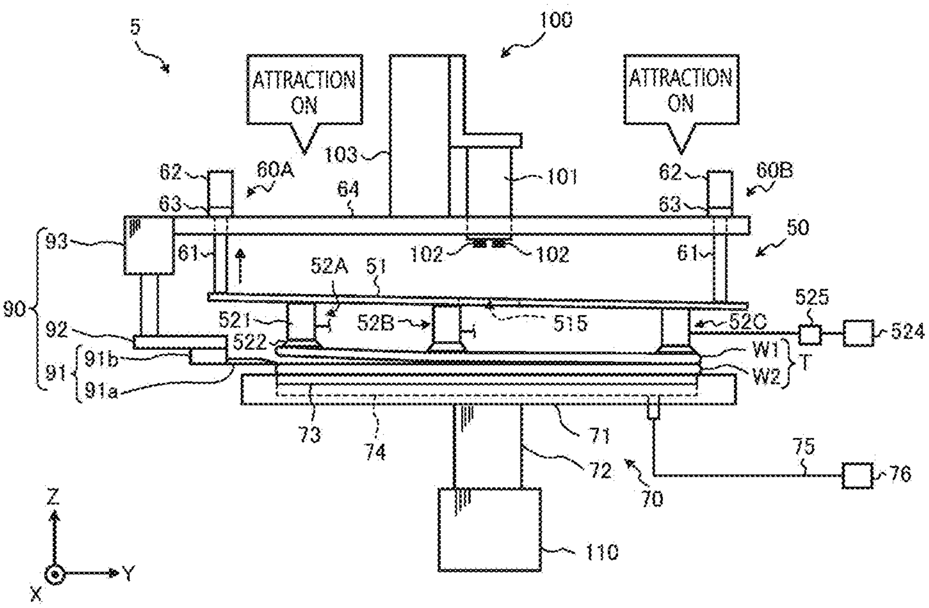
FIG. 10E is a schematic view illustrating an operation example of the separating system according to the first exemplary embodiment.
Figure 10F:
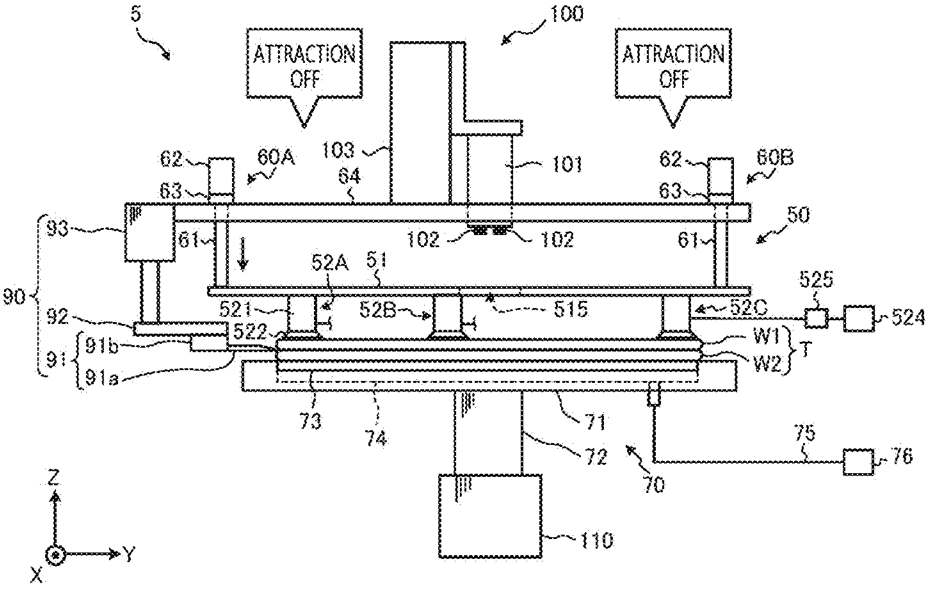
FIG. 10F is a schematic view illustrating an operation example of the separating system according to the first exemplary embodiment.
Figure 10G:
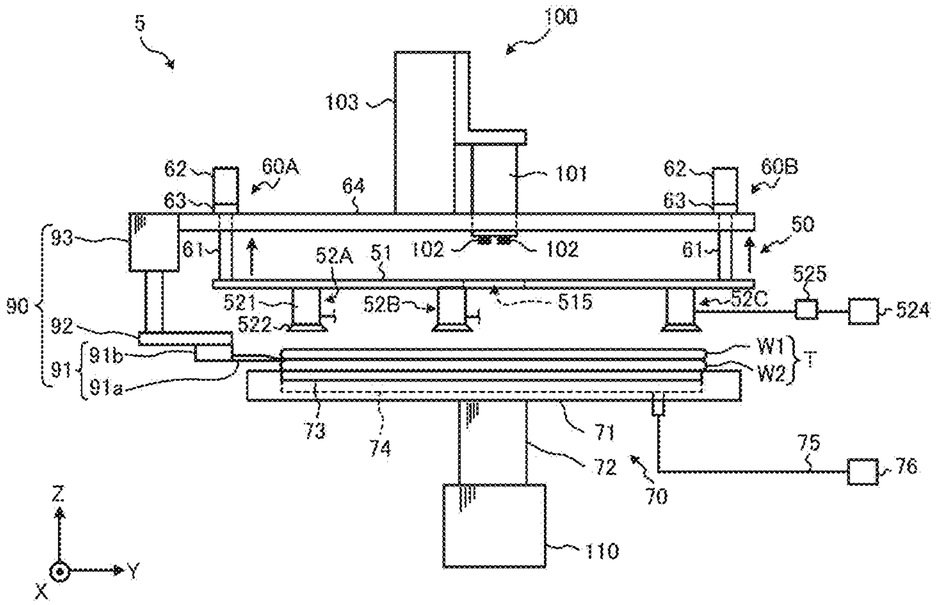
FIG. 10G is a schematic view illustrating an operation example of the separating system according to the first exemplary embodiment.
Figure 10H:
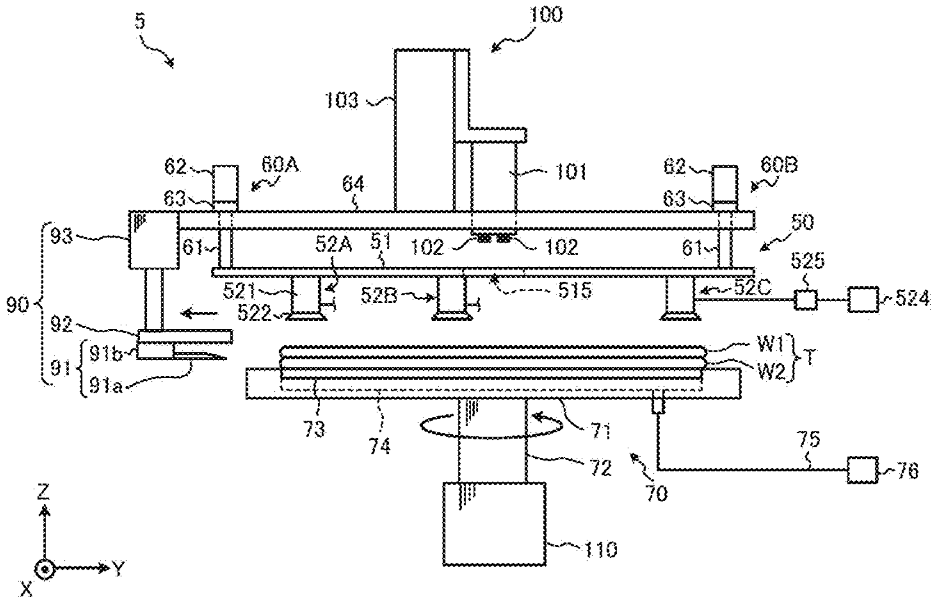
FIG. 10H is a schematic view illustrating an operation example of the separating system according to the first exemplary embodiment.
Figure 10I:
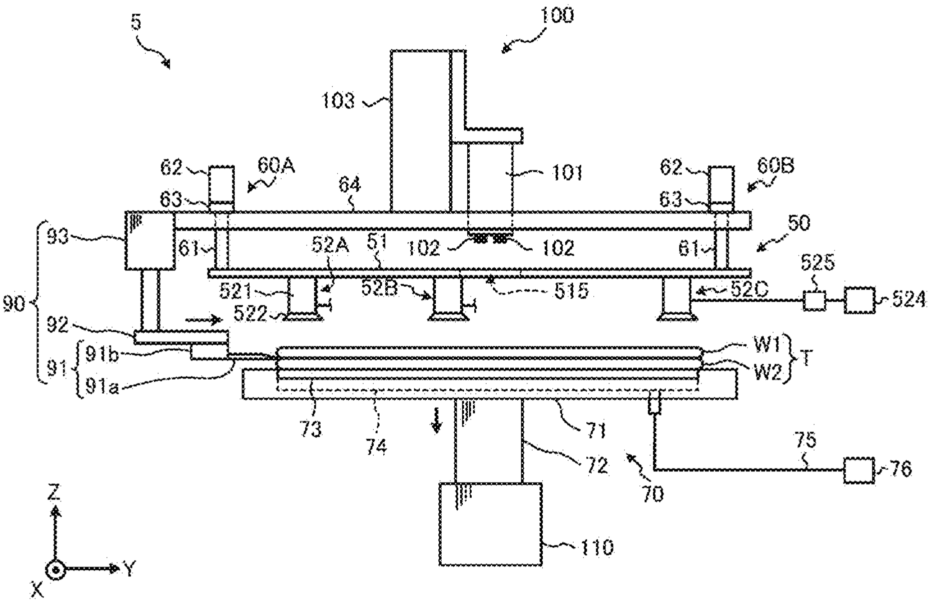
FIG. 10I is a schematic view illustrating an operation example of the separating system according to the first exemplary embodiment.
Figure 10J:
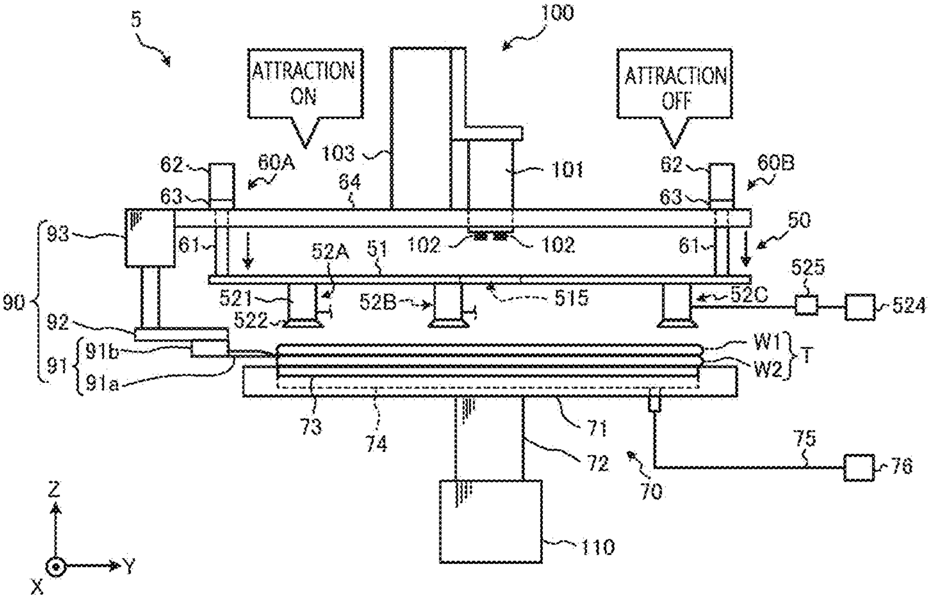
FIG. 10J is a schematic view illustrating an operation example of the separating system according to the first exemplary embodiment.
Figure 10K:
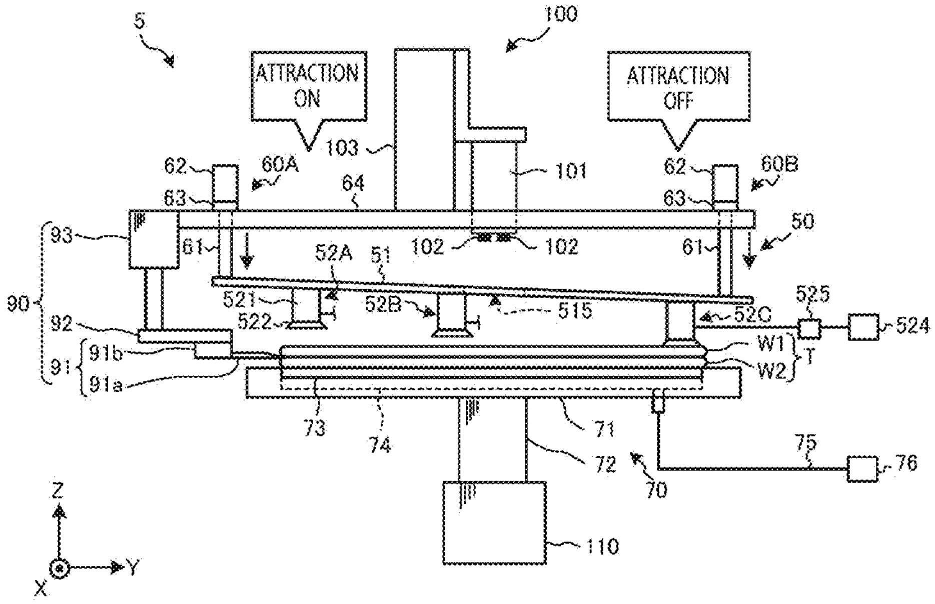
FIG. 10K is a schematic view illustrating an operation example of the separating system according to the first exemplary embodiment.
Figure 10L:
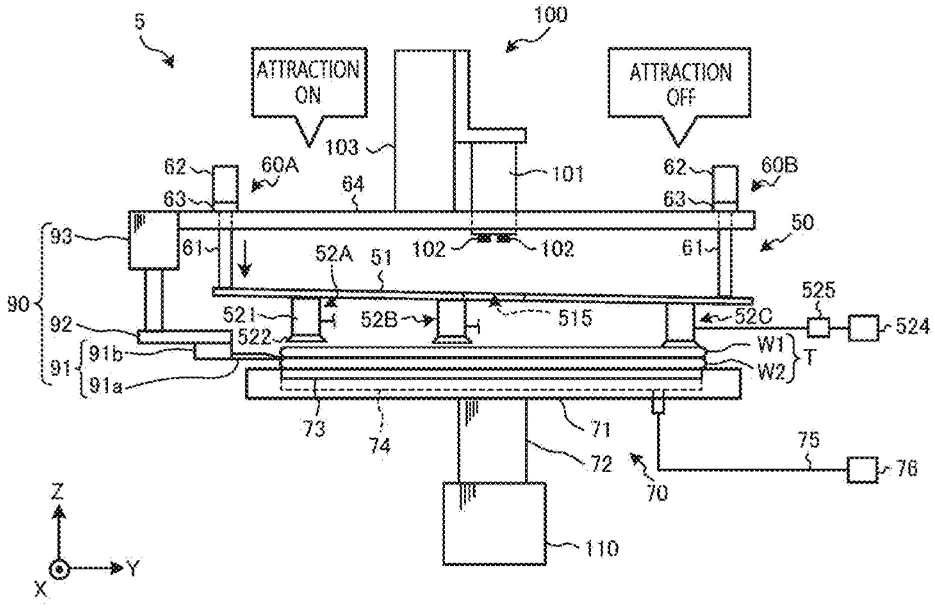
FIG. 10L is a schematic view illustrating an operation example of the separating system according to the first exemplary embodiment.
Figure 10M:
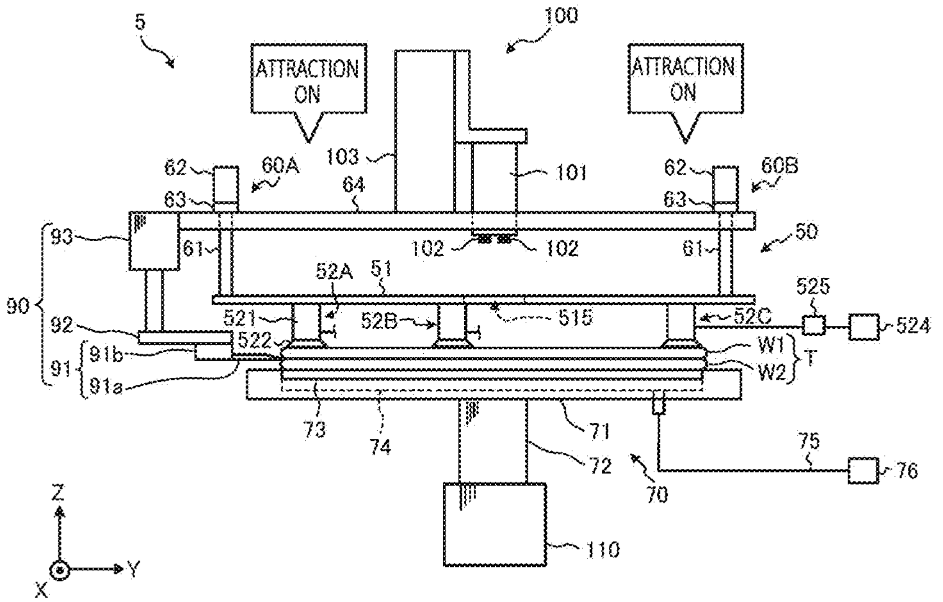
FIG. 10M is a schematic view illustrating an operation example of the separating system according to the first exemplary embodiment.
Figure 10N:
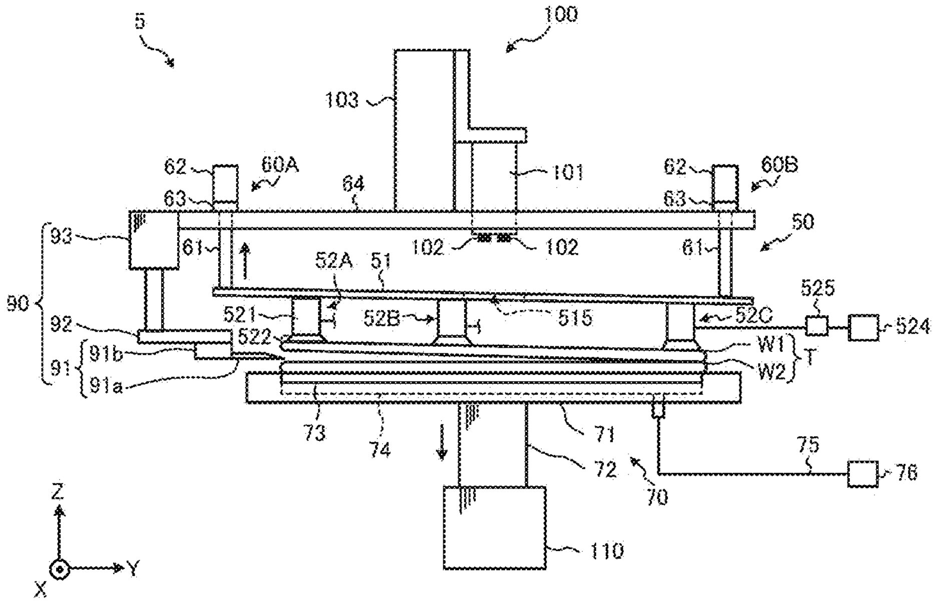
FIG. 10N is a schematic view illustrating an operation example of the separating system according to the first exemplary embodiment.
Figure 10P:
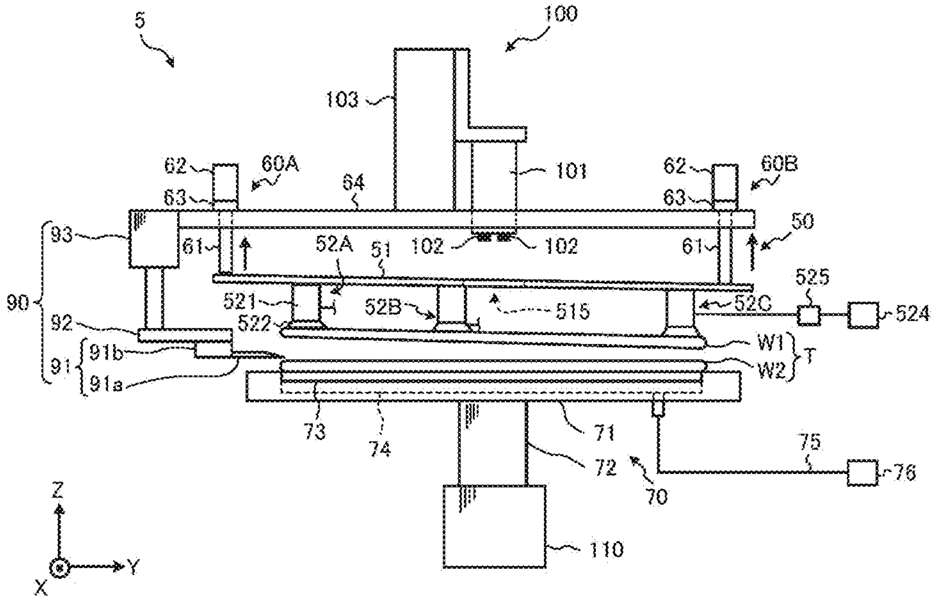
FIG. 10P is a schematic view illustrating an operation example of the separating system according to the first exemplary embodiment.

Hereinafter, a specific operation of the separating system 1 according to the first exemplary embodiment will be described with reference to FIG. 7. FIG. 7 is a flowchart illustrating a sequence of processings performed by the separating system 1 according to the first exemplary embodiment. Also, FIG. 10A to FIG. 10P are schematic views illustrating operation examples of the separating system 1 according to the first exemplary embodiment. The various processings shown in FIG. 7 are performed under the control of the control device 30.

First, the controller 31 performs a carry-in processing of the combined substrate T (process S101). In the carry-in processing, the controller 31 controls the second transfer device 211 (see FIG. 1) to transfer the combined substrate T from the delivery station 21 to the separating apparatus 5 and place the combined substrate T on the attraction surface 73 of the second holder 70. Then, the controller 31 attracts and holds the combined substrate T by attracting the non-bonding surface W2*n* of the lower wafer W2 (see FIG. 2) to the attraction surface 73.

Thereafter, the controller 31 performs a separating processing (process S102). In the separating processing, the controller 31 controls the first holder 50 to attract and hold the upper wafer W1 and then controls the elevating mechanism 60 to move the first holder 50 to be away from the lower wafer W2. Thus, the upper wafer W1 is separated from the combined substrate T.

Figure 8:
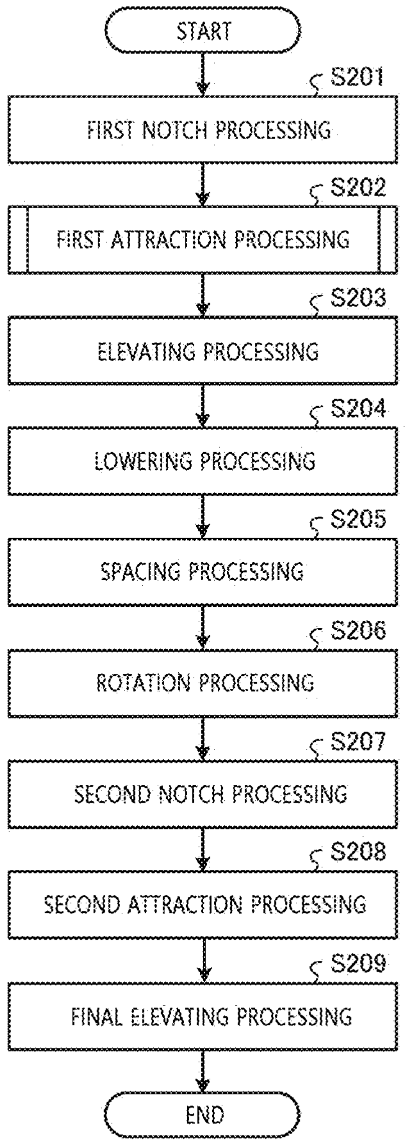
FIG. 8 is a flowchart illustrating an example of a specific sequence of a separating processing shown in a process S102.

Hereinafter, an example of a specific sequence of the separating processing in the process S102 will be described with further reference to FIG. 8. FIG. 8 is a flowchart illustrating an example of a specific sequence of the separating processing shown in the process S102.

First, the controller 31 performs a first notch processing described above with reference to FIG. 5A to FIG. 5C (process S201). In the first notch processing, the controller 31 controls the notch device 90 to form a notch in the side surface of the combined substrate T located most adjacent to the separation start point (see FIG. 10A).

Then, the controller 31 performs a first attraction processing (process S202). In the first attraction processing, the controller 31 controls the start point side elevating mechanism 60A to lower the three start point side attraction members 52A and attract the three start point side attraction members 52A to the upper wafer W1.

Figure 9:
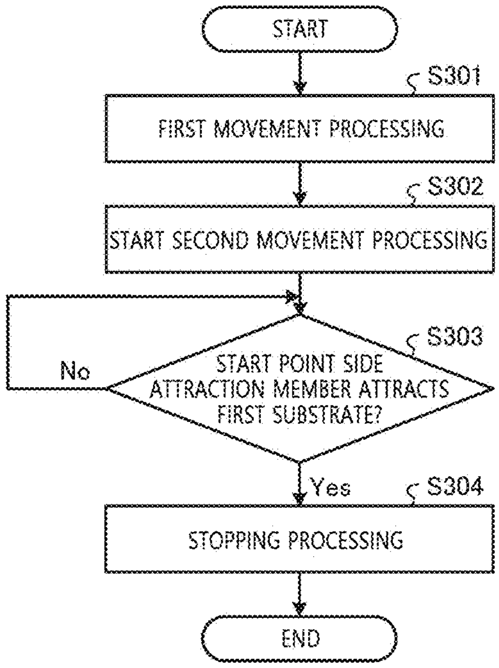
FIG. 9 is a flowchart illustrating an example of a specific sequence of a first attraction processing shown in a process S202.

Hereinafter, an example of a specific sequence of the first attraction processing in the process S202 will be described with further reference to FIG. 9. FIG. 9 is a flowchart illustrating an example of a specific sequence of the first attraction processing shown in the process S202.

First, the controller 31 performs a first movement processing (process S301). In the first movement processing, the controller 31 controls the start point side elevating mechanism 60A to move the three start point side attraction members 52A from the standby position to the speed-change position at the first speed. At the same time, the controller 31 starts attraction by the three start point side attraction members 52A. Also, the controller 31 controls the end point side elevating mechanism 60B to move the end point side attraction member 52C from the standby position to the attraction position where the upper wafer W1 is attracted at the first speed (see FIG. 10B and FIG. 10C). After the end point side attraction member 52C arrives at the attraction position, the controller 31 starts attraction by the end point side attraction member 52C.

Then, the controller 31 starts a second movement processing (process S302). In the second movement processing, the controller 31 controls the start point side elevating mechanism 60A to start moving the three start point side attraction members 52A from the speed-change position to be close to the upper wafer W1 (in the negative Z-axis direction) at the second speed (see FIG. 10C). Specifically, the controller 31 moves the three start point side attraction members 52A to be close to the upper wafer W1 by controlling the start point side elevating mechanism 60A to repeat a processing of moving the three start point side attraction members 52A by a predetermined distance at the second speed and a processing of stopping the three start point side attraction members 52A. For example, the processing of stopping the start point side attraction member 52A is performed for 0.5 seconds.

Thereafter, the controller 31 determines whether the upper wafer W1 has been attracted by the three start point side attraction members 52A based on a detection result of the detection device 525 (process S303). Specifically, when a suction pressure of the attraction pad 522 detected by the detection device 525 is equal to or greater than a threshold value, the controller 31 determines that the upper wafer W1 has been attracted by the three start point side attraction members 52A. If the upper wafer W1 has been attracted by the three start point side attraction members 52A (Yes in the process S303), the controller 31 performs a stopping processing (process S304). In the stopping processing, the controller 31 controls the start point side elevating mechanism 60A to stop the movement of the three start point side attraction members 52A (see FIG. 10D). Hereinafter, the position where the three start point side attraction members 52A is stopped in the present processing is referred to as "stop position".

Herein, in the second movement processing, if it is determined that the upper wafer W1 has been attracted based on the detection result of the detection device 525 even in the course of the processing of moving the start point side attraction member 52A by a predetermined distance at the second speed, the controller 31 performs the stopping processing of stopping the start point side attraction member 52A at that position.

As described above, after the first movement processing, the controller 31 controls the start point side elevating mechanism 60A to perform the second movement processing of moving the start point side attraction member 52A from the speed-change position to be close to the upper wafer W1 at the second speed. Also, if the controller 31 determines that the upper wafer W1 has been attracted by the start point side attraction member 52A based on the detection result of the detection device 525 during the second movement processing, the controller 31 controls the start point side elevating mechanism 60A to perform the stopping processing of stopping the movement of the start point side attraction member 52A.

As described above, the separating system 1 according to the first exemplary embodiment monitors an attraction state of the upper wafer W1 by the start point side attraction member 52A while gradually moving the start point side attraction member 52A to the upper wafer W1, and stops the movement of the start point side attraction member 52A when the upper wafer W1 is attracted. Thus, even when a part of the upper wafer W1 is pushed upwards in the notch processing, it is possible to suppress excessive pushing of the upper wafer W1 by the start point side attraction member 52A. Therefore, it is possible to suppress the occurrence of cracks in the upper wafer W1.

Further, the separating system 1 according to the first exemplary embodiment moves the start point side attraction member 52A to be close to the upper wafer W1 by repeating the processing of moving the start point side attraction member 52A by a predetermined distance at the second speed and the processing of stopping the start point side attraction member 52A in the second movement processing. Even when the start point side attraction member 52A is reaching the position where the upper wafer W1 can be attracted, there may be a time difference from when the start point side attraction member 52A reaches the attraction position to when the detection device 525 detects attraction of the upper wafer W1 by the start point side attraction member 52A. This is because if the detection device 525 is, for example, a pressure detection device, it takes time for the start point side attraction member 52A, which has reached the position where the upper wafer W1 can be attracted, to reach a suction pressure for attracting the upper wafer W1. Thus, it is possible to wait for the detection result of the detection device 525 by performing the processing of stopping the start point side attraction member 52A. Accordingly, it is possible to suppress excessive pushing of the upper wafer W1 by the start point side attraction member 52A. Therefore, it is possible to suppress the occurrence of cracks in the upper wafer.

Also, herein, there has been described an example where the start point side attraction member 52A is moved to be close to the upper wafer W1 by repeating the processing of moving the start point side attraction member 52A by a predetermined distance at the second speed and the processing of stopping the start point side attraction member 52A. However, the present disclosure is not limited thereto. In the second movement processing, the start point side attraction member 52A may not be stopped, but may be moved to be close to the upper wafer W1 at the second speed.

Further, the separating system 1 according to the first exemplary embodiment performs the above-described second movement processing only to the start point side attraction member 52A, and simply moves the end point side attraction member 52C from the standby position to the attraction position at the first speed. Accordingly, the upper wafer W1 is not pushed upwards in the other side surface of the combined substrate T in which a notch has not been formed, and, thus, cracks are less likely to occur in the upper wafer W1. Therefore, it is possible to efficiently perform the separating processing by lowering the end point side attraction member 52C to the attraction position.

Referring back to FIG. 8, subsequent operations of the separating system 1 will be described. Then, the controller 31 performs an elevating processing (process S203). In the elevating processing, the controller 31 controls the start point side elevating mechanism 60A to elevate the three start point side attraction members 52A, which attract the upper wafer W1, to be away from the second holder 70 to a predetermined position (see FIG. 10E). Herein, the predetermined position refers to, for example, a position where the elevation does not cause the occurrence of cracks in the upper wafer W1.

Then, the controller 31 performs a lowering processing (process S204). In the lowering processing, the controller 31 controls the start point side elevating mechanism 60A to move the three start point side attraction members 52A to be close to the stop position for the stopping processing (the process S304 in FIG. 9). For example, the controller 31 may move the three start point side attraction members 52A to the stop position. The controller 31 may move the three start point side attraction members 52A to a position away from the stop position in a vertically upward direction. Thereafter, the controller 31 releases attraction of the upper wafer W1 by the three start point side attraction members 52A and the end point side attraction member 52C (see FIG. 10F).

Then, the controller 31 performs a spacing processing (process S205). In the spacing processing, the controller 31 controls the start point side elevating mechanism 60A to space the three start point side attraction members 52A, which release attraction of the upper wafer W1, from the upper wafer W1 (see FIG. 10G). Specifically, the controller 31 controls the start point side elevating mechanism 60A to move the three start point side attraction members 52A to the standby position.

Thereafter, the controller 31 performs a rotation processing (process S206). In the rotation processing, the controller 31 controls the moving mechanism 92 to move the blade 91 to be away from the side surface of the combined substrate T. Then, the controller 31 controls the rotating/elevating mechanism 110 to rotate the combined substrate T attracted and held by the second holder 70 at an angle in a range of less than 360° (see FIG. 10H). For example, in the present example, the controller 31 rotates the combined substrate T at an angle of 180°.

Then, the controller 31 performs a second notch processing (process S207). In the second notch processing, the controller 31 controls the notch device 90 to form a notch in the side surface of the combined substrate T located most adjacent to the separation start point as in the first notch processing (see FIG. 10I).

Thereafter, the controller 31 performs a second attraction processing (process S208). In the second attraction processing, the controller 31 performs the first movement processing, the second movement processing, and the stopping processing shown in FIG. 9 as in the first attraction processing (see FIG. 10J to FIG. 10M). Herein, the controller 31 may perform the first movement processing, the second movement processing, and the stopping processing based on position information including the speed-change position and the stop position of the start point side attraction member 52A for the first attraction processing.

For example, in the second attraction processing, the controller 31 may change the speed-change position based on the stop position where the start point side attraction member 52A is stopped for the stopping processing in the first attraction processing. Specifically, the speed-change position of the start point side attraction member 52A for the second attraction processing may be set to a position between the speed-change position of the start point side attraction member 52A for the first attraction processing and the stop position. In this case, a distance from the speed-change position for the second movement processing in the second attraction processing to the stop position is shorter than a distance from the speed-change position for the second movement processing in the first attraction processing to the stop position. Therefore, it is possible to more efficiently move the start point side attraction member 52A in the second attraction processing than in the first attraction processing.

The controller 31 may not perform the first movement processing and the second movement processing in the second attraction processing, and may move the start point side attraction member 52A from the standby position to the stop position of the start point side attraction member 52A for the first attraction processing. Specifically, the controller 31 controls the start point side elevating mechanism 60A to move the start point side attraction member 52A from the standby position to the stop position of the start point side attraction member 52A for the first attraction processing at the first speed. Then, if it is determined that the upper wafer W1 has been attracted by the start point side attraction member 52A based on the detection result of the detection device 525, the controller 31 may perform a subsequent processing.

Subsequently, the controller 31 performs a final elevating processing (process S209). In the final elevating processing, the controller 31 controls the start point side elevating mechanism 60A to start elevating the three start point side attraction members 52A. Then, the controller 31 controls the end point side elevating mechanism 60B to elevate the end point side attraction member 52C. Thus, the upper wafer W1 is continuously separated from an end portion on the negative Y-axis side to an end portion on the positive Y-axis side. Finally, the upper wafer W1 is separated from the combined substrate T (see FIG. 10N and FIG. 10P).

As described above, the separating system 1 according to the first exemplary embodiment can more reliably separate the combined substrate T having a high adhesive strength by repeating the notch processing and the attraction processing at least twice in the separating processing. Also, in this case, as described above, it is possible to move the start point side attraction member 52A in the attraction processing of a second time and subsequent times based on position information of the start point side attraction member 52A for the previous attraction processing. Therefore, it is possible to more efficiently perform the separating processing.

Also, if the notch processing and the attraction processing are performed at least twice as described above, the controller 31 may rotate the combined substrate T at a rotation angle depending on the number of times of performing the notch processing and the attraction processing in the rotation processing. For example, if the notch processing and the attraction processing are performed three times, the controller 31 may rotate the combined substrate T at an angle of 120° obtained by dividing 360° by 3 in the rotation processing. Thus, notches may be formed at regular intervals in the side surface of the combined substrate T.

Referring back to FIG. 7, subsequent operations of the separating system 1 will be described. Then, the controller 31 performs a carry-out processing of the upper wafer W1 and the lower wafer W2 after being separated (process S103). In the carry-out processing of the lower wafer W2, the controller 31 releases the attraction and holding by the second holder 70 and moves the second holder 70 to the delivery position. Therefore, the controller 31 controls the second transfer device 211 (see FIG. 1) to carry the separated lower wafer W2 out of the separating apparatus 5 and transfer the lower wafer W2 to the delivery station 21.

Then, in the carry-out processing of the upper wafer W1, the controller 31 controls the elevating mechanism 103 to lower the attraction pads 102 of the third holder 100 to near the upper wafer W1. Thereafter, the controller 31 attracts the non-bonding surface Win of the upper wafer W1 to the attraction pads 102 of the third holder 100. Then, the controller 31 releases attraction of the upper wafer W1 by the attraction member 52 of the first holder 50. Thus, the upper wafer W1 is attracted and held by the attraction pads 102 of the third holder 100. Thereafter, the controller 31 lowers the attraction pads 102 of the third holder 100 to the delivery position of the second transfer device 211. Then, the controller 31 controls the second transfer device 211 to carry the separated upper wafer W1 out of the separating apparatus 5 and transfer the upper wafer W1 to the delivery station 21.

As described above, the separating system 1 according to the first exemplary embodiment monitors an attraction state of the upper wafer W1 by the start point side attraction member 52A while gradually moving the start point side attraction member 52A to the upper wafer W1, and stops the movement of the start point side attraction member 52A when the upper wafer W1 is attracted. Thus, even when a part of the upper wafer W1 is pushed upwards in the notch processing, it is possible to suppress excessive pushing of the upper wafer W1 by the start point side attraction member 52A. Therefore, it is possible to suppress the occurrence of cracks in the upper wafer W1.

Second Exemplary Embodiment

The separating apparatus 5 may be equipped with a sensor configured to detect the upper wafer W1. Also, the separating apparatus 5 may use the sensor to detect whether separation of the upper wafer W1 has been completed.

Figure 11:
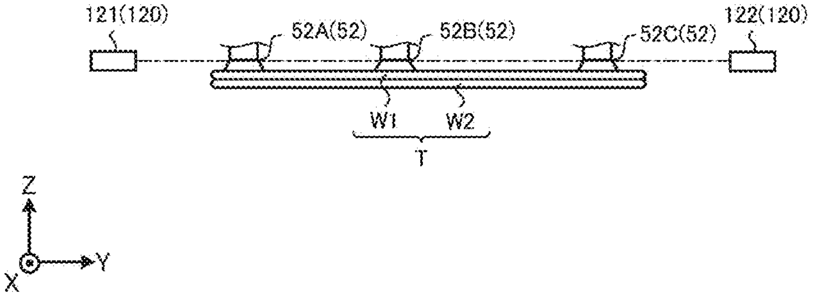
FIG. 11 is a schematic side view illustrating a positional relationship among a combined substrate, an attraction member of the first holder and a sensor according to a second exemplary embodiment.
Figure 12:
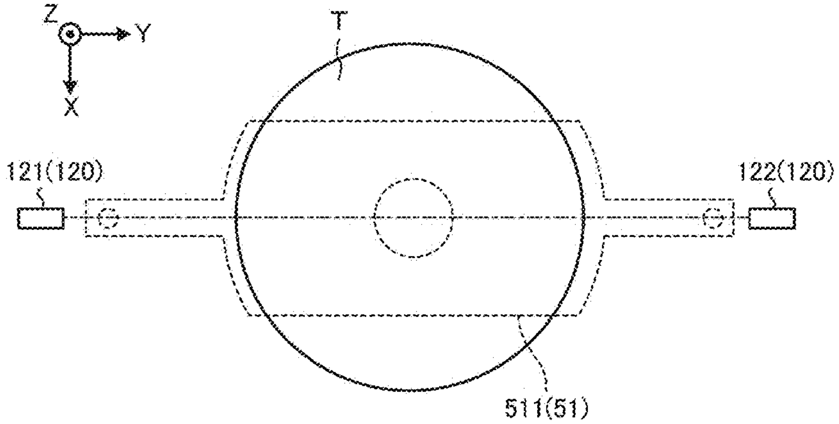
FIG. 12 is a schematic plan view illustrating a positional relationship among the combined substrate, an elastic member of the first holder and the sensor according to the second exemplary embodiment.

Hereinafter, a configuration example of the above-described sensor will be described with reference to FIG. 11 and FIG. 12. FIG. 11 is a schematic side view illustrating a positional relationship among the combined substrate T, the attraction member 52 of the first holder 50 and a sensor 120 according to a second exemplary embodiment. FIG. 12 is a schematic plan view illustrating a positional relationship among the combined substrate T, the elastic member 51 of the first holder 50, and the sensor 120 according to the second exemplary embodiment.

The sensor 120 is, for example, a photoelectric sensor. As shown in FIG. 11 and FIG. 12, the sensor 120 includes a light emitting device 121 that emits light and a light receiving device 122 that receives light from the light emitting device 121. Also, in FIG. 11 and FIG. 12, an optical axis of light emitted from the light emitting device 121 is indicated by a dashed dotted line. Herein, there has been described an example where the sensor 120 is a transmissive photoelectric sensor. However, the sensor 120 may also be a reflective photoelectric sensor. In this case, the sensor 120 just needs to include a light emitting/receiving device that emits and receives light and a light reflecting device that reflects light emitted from the light emitting/receiving device.

As shown in FIG. 11, the light emitting device 121 and the light receiving device 122 are disposed at a position away from a plate surface on the upper wafer W1 side of the combined substrate T in a direction (positive Z-axis direction) in which the upper wafer W1 is moved by the first holder 50. The light emitting device 121 is disposed on one end side of the combined substrate T. The light emitting device 121 emits light parallel to a bonding surface between the upper wafer W1 and the lower wafer W2 of the combined substrate T. The light receiving device 122 is disposed on the other end side of the combined substrate T. The light receiving device 122 receives light emitted from the light emitting device 121.

Herein, there has been described an example where the light emitting device 121 is disposed on one end side of the combined substrate T and the light receiving device 122 is disposed on the other end side of the combined substrate T.

However, the present disclosure is not limited thereto. The light receiving device 122 may be disposed on one end side of the combined substrate T and the light emitting device 121 may be disposed on the other end side of the combined substrate T.

Figure 13:
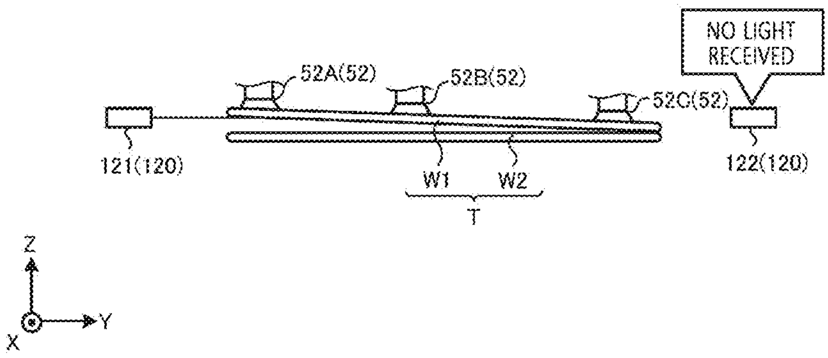
FIG. 13 is a schematic side view illustrating an example of a relationship between an upper wafer and the sensor in the separating processing.
Figure 14:
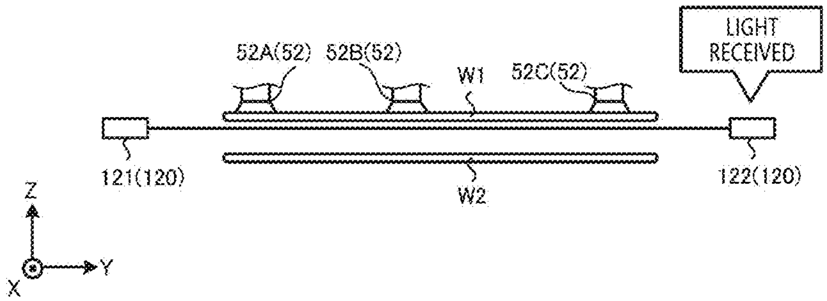
FIG. 14 is a schematic side view illustrating an example of the relationship between the upper wafer and the sensor in the separating processing.

Hereinafter, a processing of detecting whether separation of the upper wafer W1 from the lower wafer W2 has been completed will be described with reference to FIG. 13 and FIG. 14. The processing is performed by the sensor 120 under the control of the controller 31. FIG. 13 and FIG. 14 are schematic side views illustrating examples of a relationship between the upper wafer W1 and the sensor 120 in the separating processing.

The processing of detecting whether separation of the upper wafer W1 has been completed is performed in parallel with the separating processing. Hereinafter, there will be described an operation example of the sensor 120 in the separating processing when a separation inducing processing (notch processing) is performed once and then, an attraction movement processing is performed by an attraction member as described in Patent Document 1.

Specifically, in the separation inducing processing after the separating processing is started, when the light emitting device 121 emits light, the light receiving device 122 receives the light from the light emitting device 121 and sends, to the controller 31, a signal indicating that the light has been received. Then, when the controller 31 controls the start point side elevating mechanism 60A to start a processing of moving a part of an outer periphery of the first holder 50 to be away from the second holder 70, the light from the light emitting device 121 is blocked by the upper wafer W1 which is being separated and the light receiving device 122 cannot receive the light. Therefore, the light receiving device 122 sends, to the controller 31, a signal indicating that the light is not being received (see FIG. 13). When the separating processing has been completed, the light emitting device 121 may emit light. In this case, the light receiving device 122 receives the light from the light emitting device 121 and sends, to the controller 31, a signal indicating that the light has been received (see FIG. 14).

That is, in the above-described example, if light emitted from the light emitting device 121 is not received by the light receiving device 122 while the upper wafer W1 is being separated and then, the light emitted from the light emitting device 121 is received by the light receiving device 122, the controller 31 can determine that separation of the upper wafer W1 has been completed.

However, separation of the upper wafer W1 may become more complicated. In this case, when it is determined whether the separation has been completed simply based on a detection result of the sensor 120 as described above, erroneous determination may be made. Specifically, in the separating processing according to the first exemplary embodiment, the notch processing, the attraction processing, and the elevating processing are performed a plurality of number of times (see FIG. 8). When a part of the upper wafer W1 is elevated in the first elevating processing, the light from the light emitting device 121 is blocked, and, thus, the light receiving device 122 cannot receive the light. Then, when a part of the upper wafer W1 is lowered in the lowering processing, the light receiving device 122 may receive the light from the light emitting device 121. In this case, the controller 31 may erroneously determine that separation of the upper wafer W1 has been completed.

Figure 15:
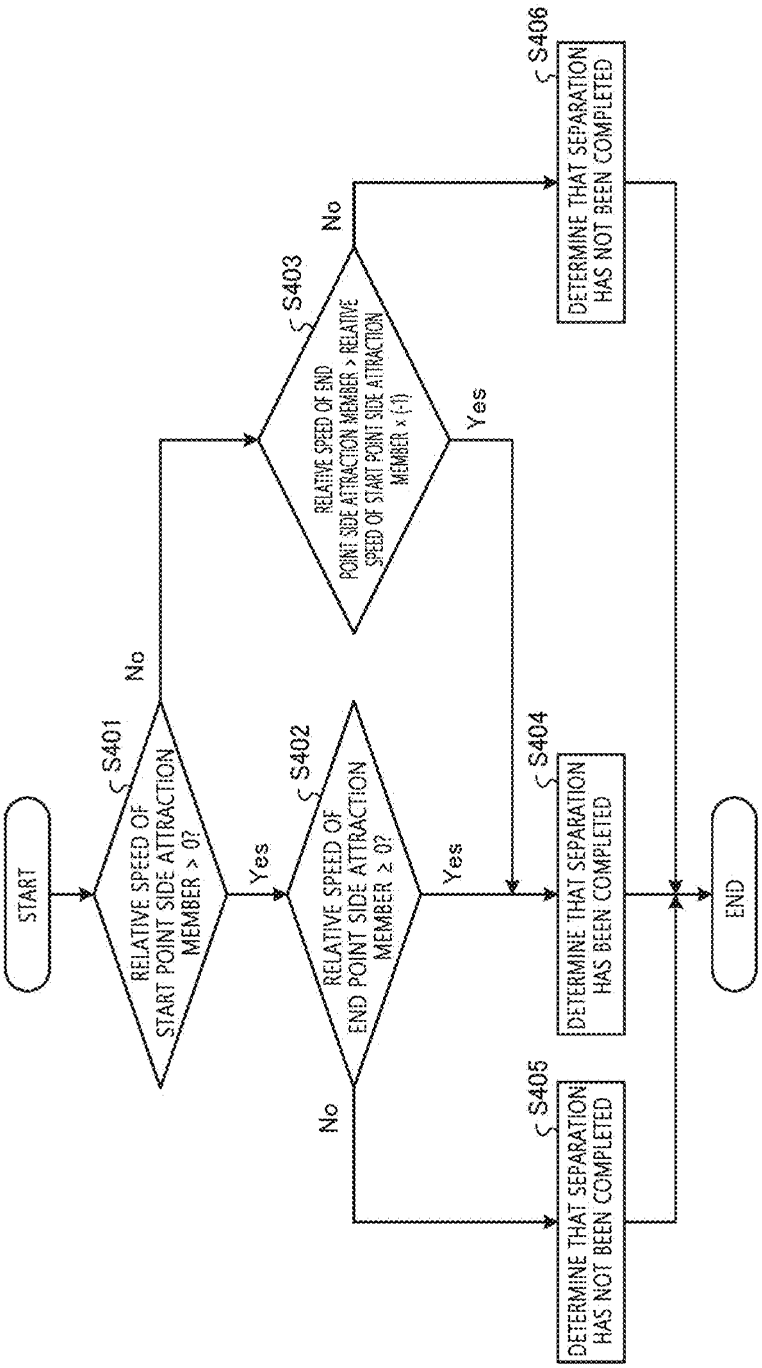
FIG. 15 is a flowchart illustrating a sequence of processings of determining whether separation by the separating system according to the second exemplary embodiment has been completed.

In this regard, the separating system 1 according to the second exemplary embodiment determines that separation of the upper wafer W1 from the lower wafer W2 has been completed based on the detection result of the sensor 120 and a position or a direction of movement of the first holder with respect to the second holder. Hereinafter, such a processing of determining whether the separation has been completed will be described with reference to FIG. 8, FIG. 10A to FIG. 10P and FIG. 15. FIG. 15 is a flowchart illustrating a sequence of the processings of determining whether the separation by the separating system 1 has been completed according to the second exemplary embodiment.

First, the sequence of the processings of determining whether separation of the upper wafer W1 has been completed based on the detection result of the sensor 120 and a position of the first holder 50 with respect to the second holder 70 will be described.

In the separating processing shown in FIG. 8, when a part of the upper wafer W1 is elevated in the elevating processing, light from the light emitting device 121 is blocked, and, thus, the light receiving device 122 cannot receive the light. Specifically, in the elevating processing (process S203) or the final elevating processing (process S209), the light receiving device 122 cannot receive the light from the light emitting device 121 and sends, to the controller 31, a signal indicating the light is not being received.

Then, when a part of the upper wafer W1 is lowered by the lowering processing (process S204) (see FIG. 10F) or the entire upper wafer W1 is separated from the lower wafer W2 by the final elevating processing (process S209) (FIG. 10P), the light receiving device 122 receives light from the light emitting device 121 and sends, to the controller 31, a signal indicating that the light has been received.

In this case, the controller 31 determines whether separation of the upper wafer W1 from the lower wafer W2 has been completed based on the position of the first holder 50. Specifically, when the first holder 50 is located above light emitted from the light emitting device 121, the controller 31 determines that the separation has been completed. For example, in the above-described final elevating processing, the first holder 50 is located above light emitted from the light emitting device 121, and, thus, it is determined that the separation has been completed. Meanwhile, in the lowering processing, the first holder 50 is located below light emitted from the light emitting device 121, and, thus, it is determined that the separation has not been completed. Also, for example, an imaging device configured to take an image of the combined substrate T from a lateral side may be used to detect the position of the first holder 50.

Hereinafter, a sequence of processings of determining whether separation of the upper wafer W1 has been completed based on the detection result of the sensor 120 and a direction of movement of the first holder 50 with respect to the second holder 70 will be described.

Since a part of the upper wafer W1 is elevated, light emitted from the light emitting device 121 is not received by the light receiving device 122 and then, the light emitted from the light emitting device 121 is received by the light receiving device 122. In this case, if the first holder 50 is moved to be away from the second holder 70, the controller 31 determines that the separation has been completed as in the processing of determining whether the separation has been completed based on the position of the first holder. For example, in the above-described final elevating processing, the first holder 50 (particularly, the end point side attraction member 52C) is moved to be away from the second holder 70, and, thus, it is determined that the separation has been completed. Meanwhile, in the lowering processing, the first holder 50 (particularly, the start point side attraction member 52A) is moved to be close to the second holder 70, and, thus, it is determined that the separation has not been completed. Also, for example, an imaging device configured to take an image of the combined substrate T from a lateral side may be used to detect the direction of movement of the first holder.

Further, the controller 31 may determine whether separation of the upper wafer W1 has been completed based on a movement speed of the first holder including the direction of movement of the first holder. Specifically, the controller 31 may determine whether separation of the upper wafer W1 has been completed based on a relative speed of the first holder 50 with respect to the second holder 70. FIG. 15 is a flowchart illustrating a sequence of processings of determining whether separation of the upper wafer W1 has been completed based on the relative speed of the first holder 50 with respect to the second holder 70.

The processing shown in the flowchart of FIG. 15 starts in a case where light emitted from the light emitting device 121 is not received by the light receiving device 122 due to the elevation of a part of the upper wafer W1 and then, the light emitted from the light emitting device 121 is received by the light receiving device 122 in the separating processing. For example, as for the separating processing shown in FIG. 8, the processing shown in the flowchart of FIG. 15 starts in the lowering processing or the final elevating processing as described above.

In the following description, a relative speed of the start point side attraction member 52A with respect to the second holder 70 refers to a value obtained by subtracting a movement speed of the second holder 70 in the vertical direction from a movement speed of the start point side attraction member 52A in the vertical direction when a positive vertical direction is defined as a positive direction. Also, a relative speed of the end point side attraction member 52C of the first holder 50 with respect to the second holder 70 refers to a value obtained by subtracting a movement speed of the second holder 70 in the vertical direction from a movement speed of the end point side attraction member 52C in the vertical direction when the positive vertical direction is defined as the positive direction. Hereinafter, the relative speed of the start point side attraction member 52A with respect to the second holder 70 is denoted as "V1" and the relative speed of the end point side attraction member 52C with respect to the second holder 70 is denoted as "V2".

First, the controller 31 determines whether V1 is greater than 0 (process S401). For example, when the start point side attraction member 52A is moved to be away from the second holder 70, V1 becomes greater than 0, and when the start point side attraction member 52A is stopped or moved to be close to the second holder 70, V1 becomes equal to or smaller than 0. Therefore, as for the separating processing shown in FIG. 8, V1 becomes equal to or smaller than 0 in the lowering processing, whereas V1 becomes greater than 0 in the final elevating processing.

When V1 is greater than 0 (Yes in the process S401), the controller 31 proceeds to a process S402, and when V1 is equal to or smaller than 0 (No in the process S401), the controller 31 proceeds to a process S403.

Then, the controller 31 determines whether V2 is equal to or greater than 0 (process S402). For example, when the end point side attraction member 52C is moved to be away from the second holder 70 or stopped, V2 becomes equal to or greater than 0, and when the end point side attraction member 52C is moved to be close to the second holder 70, V2 becomes smaller than 0. Therefore, as for the separating processing shown in FIG. 8, V2 becomes equal to or greater than 0 in the final elevating processing.

When V2 is equal to or greater than 0 (Yes in the process S402), the controller 31 determines that the separation has been completed (process S404) and ends the processing. Meanwhile, when V2 is smaller than 0 (No in the process S402), the controller 31 determines that the separation has not been completed (process S405) and ends the processing.

Thereafter, the controller 31 determines whether V2 is greater than −V1 (process S403). For example, when the end point side attraction member 52C is moved to be away from the second holder 70 at a higher movement speed than the start point side attraction member 52A, V2 becomes greater than −V1, and when the end point side attraction member 52C is stopped or a movement speed of the start point side attraction member 52A when the start point side attraction member 52A is moved to be close to the second holder 70 is higher than a movement speed of the end point side attraction member 52C when the end point side attraction member 52C is moved to be away from the second holder 70, V2 becomes equal to or smaller than −V1. Therefore, as for the separating processing shown in FIG. 8, V2 becomes equal to or smaller than −V1 in the lowering processing.

When V2 is greater than −V1 (Yes in the process S403), the controller 31 determines that the separation has been completed (process S404) and ends the processing. Meanwhile, when V2 is equal to or smaller than −V1 (No in the process S403), the controller 31 determines that the separation has not been completed (process S406) and ends the processing.

As described above, if light emitted from the light emitting device 121 is not received by the light receiving device 122 and then, the light emitted from the light emitting device 121 is received by the light receiving device 122 after the separating processing is started, it is determined that the separation has been completed when V1 is greater than 0 and V2 is equal to or greater than 0 or when V1 is equal to or smaller than 0 or V2 is greater than −V1.

Also, the controller 31 may obtain a movement distance and a movement speed of the first holder 50 and a movement distance and a movement speed of the second holder 70 in the separating processing from recipe information indicating contents of the separating processing stored in the storage 32, and calculate the relative speed of the first holder 50 with respect to the second holder 70 based on the obtained information.

Herein, there has been described an example where it is determined that the separation has been completed by using the relative speed of the first holder 50 with respect to the second holder 70. However, the present disclosure is not limited thereto. It may be determined that the separation is completed by using only the movement speed of the first holder 50 without considering the movement speed of the second holder 70.

As described above, the separating system 1 according to the second exemplary embodiment determines whether separation of the upper wafer W1 from the lower wafer W2 has been completed based on a position or a direction of movement of the first holder 50 with respect to the second holder 70 if light emitted from the light emitting device 121 is not received by the light receiving device 122 due to the separation of a part of the upper wafer W1 from the lower wafer W2 and then, the light emitted from the light emitting device 121 is received by the light receiving device 122 after the separating processing is started. Therefore, the separating apparatus 5 according to the second exemplary embodiment can suppress making erroneous determination on whether the separation has been completed.

Herein, there has been described an example where the processing of detecting whether the separation has been completed is applied to the separating processing shown in FIG. 8. However, the present disclosure is not limited thereto. The processing of detecting whether the separation has been completed can also be applied to the separating processing in which the separation inducing processing and the attraction movement processing are performed once as described in Patent Document 1.

It should be noted that the above-described exemplary embodiment is illustrative in all aspects and is not anyway limiting. The above-described exemplary embodiment may be omitted, replaced and modified in various ways without departing from the scope and the spirit of claims.

The present disclosure may also adopt the following configurations.

(1)

A separating apparatus, including:

a notch device configured to form a notch by inserting a sharp member into a side surface located most adjacent to a separation start point among side surfaces of a combined substrate in which a first substrate and a second substrate are bonded to each other;

a first holder, configured to attract and hold the first substrate of the combined substrate, including a start point side attraction member configured to attract an edge of an outer periphery located most adjacent to the separation start point in the outer periphery of the first substrate, and a start point side elevating mechanism configured to elevate the start point side attraction member;

a second holder configured to attract and hold the second substrate of the combined substrate;

a detection device configured to detect attraction of the first substrate by the start point side attraction member; and a controller configured to control the notch device to perform a notch processing of forming the notch in the side surface located most adjacent to the separation start point among the side surfaces of the combined substrate, and control the start point side elevating mechanism to perform an attraction processing of lowering the start point side attraction member to attract the start point side attraction member to the first substrate after the notch processing, wherein in the attraction processing, the controller controls the start point side elevating mechanism to perform a first movement processing of moving the start point side attraction member from a standby position, which is spaced apart from the first substrate, to a speed-change position, which is closer to the first substrate than the standby position, as a position before being contacted with the first substrate at a first speed; controls the start point side elevating mechanism to perform a second movement processing of moving the start point side attraction member from the speed-change position to be close to the first substrate at a second speed, which is lower than the first speed, after the first movement processing; and controls the start point side elevating mechanism to perform a stopping processing of stopping a movement of the start point side attraction member when it is determined that the first substrate is attracted by the start point side attraction member based on a detection result of the detection device during the second movement processing.

(2)

The separating apparatus described in (1), wherein in the second movement processing, the controller controls the start point side elevating mechanism to move the start point side attraction member to be close to the first substrate by repeating a processing of moving the start point side attraction member by a predetermined distance and then a processing of stopping the start point side attraction member.

(3)

The separating apparatus described in (2), wherein the controller performs the stopping processing when it is determined that the first substrate is attracted by the start point side attraction member based on the detection result of the detection device during the processing of moving the start point side attraction member by the predetermined distance.

(4)

The separating apparatus described in any one of (1) to (3), wherein the first holder includes:

an end point side attraction member configured to attract an edge of the outer periphery located most adjacent to a separation end point in the outer periphery of the first substrate; and an end point side elevating mechanism configured to elevate the end point side attraction member, and wherein the controller controls the end point side elevating mechanism to move the end point side attraction member at the first speed from the standby position to an attraction position where the first substrate is attracted.

(5)

The separating apparatus described in any one of (1) to (4), further including:

a rotating mechanism configured to rotate the second holder, wherein the notch processing and the attraction processing are repeated at least twice, and the controller controls, between the notch processing and the attraction processing and a subsequent notch processing and a subsequent attraction processing, the start point side elevating mechanism to perform an elevating processing of elevating the start point side attraction member, which attracts the first substrate; controls, after the elevating processing, the start point side elevating mechanism to perform a lowering processing of moving the start point side attraction member to be close to a stop position where the start point side attraction member is stopped in the stopping processing; controls, after the lowering processing, the start point side elevating mechanism to perform a spacing processing of spacing the start point side attraction member, which releases the attraction of the first substrate, from the first substrate; and controls, after the spacing processing, the rotating mechanism to perform a rotation processing of rotating the combined substrate at an angle in a range of less than 360°.

(6)

The separating apparatus described in (5), wherein in the subsequent attraction processing, the controller changes the speed-change position based on the stop position where the start point side attraction member is stopped in the stopping processing of a previous attraction processing.

(7)

The separating apparatus described in (5), wherein in the subsequent attraction processing, the controller moves the start point side attraction member to the stop position where the start point side attraction member is stopped in the stopping processing of a previous attraction processing without performing the first movement processing and the second movement processing.

(8)

A separating system, including:

a carry-in/out station where a combined substrate in which a first substrate and a second substrate are bonded to each other is disposed;

a substrate transfer device configured to transfer the combined substrate disposed in the carry-in/out station; and a separating apparatus configured to separate the combined substrate transferred by the substrate transfer device into the first substrate and the second substrate, wherein the separating apparatus includes:

a notch device configured to form a notch by inserting a sharp member into a side surface located most adjacent to a separation start point among side surfaces of the combined substrate;

a first holder, configured to attract and hold the first substrate of the combined substrate, including a start point side attraction member configured to attract an edge of an outer periphery located most adjacent to the separation start point in the outer periphery of the first substrate and a start point side elevating mechanism configured to elevate the start point side attraction member;

a second holder configured to attract and hold the second substrate of the combined substrate;

a detection device configured to detect attraction of the first substrate by the start point side attraction member; and a controller configured to control the notch device to perform a notch processing of forming the notch in the side surface located most adjacent to the separation start point among the side surfaces of the combined substrate, and control the start point side elevating mechanism to perform an attraction processing of lowering the start point side attraction member to attract the start point side attraction member to the first substrate after the notch processing, and wherein in the attraction processing, the controller controls the start point side elevating mechanism to perform a first movement processing of moving the start point side attraction member from a standby position, which is spaced apart from the first substrate, to a speed-change position, which is closer to the first substrate than the standby position, as a position before being contacted with the first substrate at a first speed; controls the start point side elevating mechanism to perform a second movement processing of moving the start point side attraction member from the speed-change position to be close to the first substrate at a second speed, which is lower than the first speed, after the first movement processing; and controls the start point side elevating mechanism to perform a stopping processing of stopping a movement of the start point side attraction member when it is determined that the first substrate is attracted by the start point side attraction member based on a detection result of the detection device during the second movement processing.

(9)

A separating method of separating a combined substrate in which a first substrate and a second substrate are bonded to each other into the first substrate and the second substrate, including:

attracting and holding the second substrate of the combined substrate by using a second holder configured to attract and hold the second substrate;

forming a notch in a side surface located most adjacent to a separation start point among side surfaces of the combined substrate by using a notch device configured to form a notch by inserting a sharp member into the side surface located most adjacent to the separation start point among the side surfaces of the combined substrate; and lowering, after the forming of the notch, a start point side attraction member, the start point side attraction member being configured to attract an edge of an outer periphery located most adjacent to the separation start point in the outer periphery of the first substrate, to attract the start point side attraction member to the first substrate by using a start point side elevating mechanism, the start point side elevating mechanism being configured to elevate the start point side attraction member, wherein the lowering of the start point side attraction member includes:

moving the start point side attraction member from a standby position, which is spaced apart from the first substrate, to a speed-change position, which is closer to the first substrate than the standby position, as a position before being contacted with the first substrate at a first speed by controlling the start point side elevating mechanism;

moving, after the moving of the start point side attraction member at the first speed, the start point side attraction member from the speed-change position to be close to the first substrate at a second speed, which is lower than the first speed, by controlling the start point side elevating mechanism; and stopping, during the moving of the start point side attraction member at the second speed, a movement of the start point side attraction member when it is determined that the first substrate has been attracted by the start point side attraction member, which attracts and holds the first substrate of the combined substrate, based on a detection result of a detection device configured to detect attraction of the first substrate by the start point side attraction member by controlling the start point side elevating mechanism.

According to the present disclosure, it is possible to reduce the generation of the crack of the substrate.

From the foregoing, it will be appreciated that various exemplary embodiments of the present disclosure have been described herein for purposes of illustration and various changes can be made without departing from the scope and spirit of the present disclosure. Accordingly, various exemplary embodiments described herein are not intended to be limiting, and the true scope and spirit are indicated by the following claims.

We claim:

1. A separating apparatus, comprising:

a notch device comprising a sharp member and configured to form a notch by inserting the sharp member into a side surface located most adjacent to a separation start point among side surfaces of a combined substrate in which a first substrate and a second substrate are bonded to each other;

a first holder, configured to attract and hold the first substrate of the combined substrate, including a start point side attraction member configured to attract an edge of an outer periphery located most adjacent to the separation start point in the outer periphery of the first substrate, and a start point side elevating mechanism configured to elevate the start point side attraction member;

a second holder configured to attract and hold the second substrate of the combined substrate;

a detection device configured to detect attraction of the first substrate by the start point side attraction member; and a controller configured to control the notch device to perform a notch processing of forming the notch in the side surface located most adjacent to the separation start point among the side surfaces of the combined substrate, and control the start point side elevating mechanism to perform an attraction processing of lowering the start point side attraction member to attract the start point side attraction member to the first substrate after the notch processing, wherein in the attraction processing, the controller controls the start point side elevating mechanism to perform a first movement processing of moving the start point side attraction member from a standby position, which is spaced apart from the first substrate, to a speed-change position, which is closer to the first substrate than the standby position, as a position before being contacted with the first substrate at a first speed; controls the start point side elevating mechanism to perform a second movement processing of moving the start point side attraction member from the speed-change position to be close to the first substrate at a second speed, which is lower than the first speed, after the first movement processing; and controls the start point side elevating mechanism to perform a stopping processing of stopping a movement of the start point side attraction member when it is determined that the first substrate is attracted by the start point side attraction member based on a detection result of the detection device during the second movement processing, wherein in the second movement processing, the controller controls the start point side elevating mechanism to move the start point side attraction member to be close to the first substrate by repeating a process of moving the start point side attraction member by a predetermined distance and then a process of stopping the start point side attraction member.

2. The separating apparatus of claim 1, wherein the controller performs the stopping processing when it is determined that the first substrate is attracted by the start point side attraction member based on the detection result of the detection device during the processing of moving the start point side attraction member by the predetermined distance.

3. The separating apparatus of claim 1, wherein the first holder includes:

an end point side attraction member configured to attract an edge of the outer periphery located most adjacent to a separation end point in the outer periphery of the first substrate; and an end point side elevating mechanism configured to elevate the end point side attraction member, and wherein the controller controls the end point side elevating mechanism to move the end point side attraction member at the first speed from the standby position to an attraction position where the first substrate is attracted.

4. The separating apparatus of claim 1, further comprising:

a rotating mechanism configured to rotate the second holder, wherein the notch processing and the attraction processing are repeated at least twice, and the controller controls, between the notch processing and the attraction processing and a subsequent notch processing and a subsequent attraction processing, the start point side elevating mechanism to perform an elevating processing of elevating the start point side attraction member, which attracts the first substrate; controls, after the elevating processing, the start point side elevating mechanism to perform a lowering processing of moving the start point side attraction member to be close to a stop position where the start point side attraction member is stopped in the stopping processing; controls, after the lowering processing, the start point side elevating mechanism to perform a spacing processing of spacing the start point side attraction member, which releases the attraction of the first substrate, from the first substrate; and controls, after the spacing processing, the rotating mechanism to perform a rotation processing of rotating the combined substrate at an angle in a range of less than 360°.

5. The separating apparatus of claim 4, wherein in the subsequent attraction processing, the controller changes the speed-change position based on the stop position where the start point side attraction member is stopped in the stopping processing of a previous attraction processing.

6. The separating apparatus of claim 4, wherein in the subsequent attraction processing, the controller moves the start point side attraction member to the stop position where the start point side attraction member is stopped in the stopping processing of a previous attraction processing without performing the first movement processing and the second movement processing.

7. A separating system, comprising:

a carry-in/out station where a combined substrate in which a first substrate and a second substrate are bonded to each other is disposed;

a substrate transfer device configured to transfer the combined substrate disposed in the carry-in/out station; and a separating apparatus configured to separate the combined substrate transferred by the substrate transfer device into the first substrate and the second substrate, wherein the separating apparatus includes:

a notch device comprising a sharp member and configured to form a notch by inserting the sharp member into a side surface located most adjacent to a separation start point among side surfaces of the combined substrate;

a first holder, configured to attract and hold the first substrate of the combined substrate, including a start point side attraction member configured to attract an edge of an outer periphery located most adjacent to the separation start point in the outer periphery of the first substrate and a start point side elevating mechanism configured to elevate the start point side attraction member;

a second holder configured to attract and hold the second substrate of the combined substrate;

a detection device configured to detect attraction of the first substrate by the start point side attraction member; and a controller configured to control the notch device to perform a notch processing of forming the notch in the side surface located most adjacent to the separation start point among the side surfaces of the combined substrate, and control the start point side elevating mechanism to perform an attraction processing of lowering the start point side attraction member to attract the start point side attraction member to the first substrate after the notch processing, and wherein in the attraction processing, the controller controls the start point side elevating mechanism to perform a first movement processing of moving the start point side attraction member from a standby position, which is spaced apart from the first substrate, to a speed-change position, which is closer to the first substrate than the standby position, as a position before being contacted with the first substrate at a first speed; controls the start point side elevating mechanism to perform a second movement processing of moving the start point side attraction member from the speed-change position to be close to the first substrate at a second speed, which is lower than the first speed, after the first movement processing; and controls the start point side elevating mechanism to perform a stopping processing of stopping a movement of the start point side attraction member when it is determined that the first substrate is attracted by the start point side attraction member based on a detection result of the detection device during the second movement processing, wherein in the second movement processing, the controller controls the start point side elevating mechanism to move the start point side attraction member to be close to the first substrate by repeating a process of moving the start point side attraction member by a predetermined distance and then a process of stopping the start point side attraction member.

8. A separating method of separating a combined substrate in which a first substrate and a second substrate are bonded to each other into the first substrate and the second substrate, comprising:

attracting and holding the second substrate of the combined substrate by using a second holder configured to attract and hold the second substrate;

forming a notch in a side surface located most adjacent to a separation start point among side surfaces of the combined substrate by using a notch device comprising a sharp member and configured to form a notch by inserting the sharp member into the side surface located most adjacent to the separation start point among the side surfaces of the combined substrate; and lowering, after the forming of the notch, a start point side attraction member, the start point side attraction member being configured to attract an edge of an outer periphery located most adjacent to the separation start point in the outer periphery of the first substrate, to attract the start point side attraction member to the first substrate by using a start point side elevating mechanism, the start point side elevating mechanism being configured to elevate the start point side attraction member, wherein the lowering of the start point side attraction member includes:

moving the start point side attraction member from a standby position, which is spaced apart from the first substrate, to a speed-change position, which is closer to the first substrate than the standby position, as a position before being contacted with the first substrate at a first speed by controlling the start point side elevating mechanism;

moving, after the moving of the start point side attraction member at the first speed, the start point side attraction member from the speed-change position to be close to the first substrate at a second speed, which is lower than the first speed, by controlling the start point side elevating mechanism; and stopping, during the moving of the start point side attraction member at the second speed, a movement of the start point side attraction member when it is determined that the first substrate has been attracted by the start point side attraction member, which attracts and holds the first substrate of the combined substrate, based on a detection result of a detection device configured to detect attraction of the first substrate by the start point side attraction member by controlling the start point side elevating mechanism, wherein in the moving of the start point side attraction member at the second speed, by the start point side elevating mechanism, the start point side attraction member is moved to be close to the first substrate by repeating a process of moving the start point side attraction member by a predetermined distance and then a process of stopping the start point side attraction member.

* * * * *